US011383328B2

(12) United States Patent
Ikeno et al.

(10) Patent No.: US 11,383,328 B2
(45) Date of Patent: Jul. 12, 2022

(54) METHOD FOR MANUFACTURING PEELED SUBSTRATE

(71) Applicants: SHIN-ETSU POLYMER CO., LTD., Tokyo (JP); NATIONAL UNIVERSITY CORPORATION SAITAMA UNIVERSITY, Saitama (JP)

(72) Inventors: Junichi Ikeno, Saitama (JP); Yohei Yamada, Saitama (JP); Hideki Suzuki, Saitama (JP); Rika Matsuo, Saitama (JP)

(73) Assignees: SHIN-ETSU POLYMER CO., LTD., Tokyo (JP); NATIONAL UNIVERSITY CORPORATION SAITAMA UNIVERSITY, Saitama (JP)

( * ) Notice: Subject to any disclaimer, the term of this patent is extended or adjusted under 35 U.S.C. 154(b) by 501 days.

(21) Appl. No.: 16/486,316

(22) PCT Filed: Oct. 26, 2017

(86) PCT No.: PCT/JP2017/038669
§ 371 (c)(1),
(2) Date: Aug. 15, 2019

(87) PCT Pub. No.: WO2018/150636
PCT Pub. Date: Aug. 23, 2018

(65) Prior Publication Data
US 2020/0230748 A1    Jul. 23, 2020

(30) Foreign Application Priority Data
Feb. 16, 2017  (JP) .............................. JP2017-027121

(51) Int. Cl.
*B23K 26/53*     (2014.01)
*B23K 26/064*    (2014.01)
(Continued)

(52) U.S. Cl.
CPC ............ *B23K 26/53* (2015.10); *B23K 26/064* (2015.10); *C01B 32/956* (2017.08); *C09K 13/02* (2013.01);
(Continued)

(58) Field of Classification Search
None
See application file for complete search history.

(56) References Cited

U.S. PATENT DOCUMENTS 8,395,084 B2 *  3/2013  Tanaka .................. H01L 21/268
                                                  219/121.73
10,840,141 B2 * 11/2020  Ohtani ............... B23K 26/0622
(Continued)

FOREIGN PATENT DOCUMENTS

JP      2011-151317 A    8/2011
JP      2011-161491 A    8/2011
(Continued)

*Primary Examiner* — Allan W. Olsen
(74) *Attorney, Agent, or Firm* — Nath, Goldberg & Meyer; Jerald L. Meyer; Tanya E. Harkins

(57) ABSTRACT

A method for manufacturing a peeled substrate has a laser condensing step for focusing laser light at a prescribed depth from the surface of a substrate and a positioning step for moving and positioning a laser condenser relative to the substrate, the method involving forming a processed layer in the substrate. The laser condensing step includes a laser light adjustment step in which a diffraction optical element is used to branch the laser light into a plurality of branched laser beams, and at least one of the branched laser beams is branched such that the intensity thereof differs from the other branched laser beams. The processed layer is elongated using the branched laser beam having a relatively high (Continued)

intensity among the plurality of branched laser beams to process the substrate, and the elongation of the processed layer is restrained using the branched laser beams having a relatively low intensity.

10 Claims, 25 Drawing Sheets

(51) Int. Cl.
    *C01B 32/956*     (2017.01)
    *C09K 13/02*     (2006.01)
    *C30B 29/36*     (2006.01)
    *C30B 33/04*     (2006.01)
    *C30B 33/10*     (2006.01)
    *H01L 21/02*     (2006.01)

(52) U.S. Cl.
    CPC .............. *C30B 29/36* (2013.01); *C30B 33/04* (2013.01); *C30B 33/10* (2013.01); *H01L 21/02019* (2013.01)

(56) References Cited

U.S. PATENT DOCUMENTS

| | | | | |
|---|---|---|---|---|
| 2007/0178672 A1* | 8/2007 | Tanaka | ............... | H01L 21/02683 257/E27.113 |
| 2009/0066885 A1* | 3/2009 | Kumai | ................ | G02B 5/3058 427/163.1 |
| 2010/0039707 A1* | 2/2010 | Akahane | .............. | H04N 9/3129 359/321 |
| 2013/0312460 A1* | 11/2013 | Kunishi | ................... | C30B 33/06 65/112 |
| 2018/0315657 A1* | 11/2018 | Ikeno | ....................... | C30B 33/06 |
| 2019/0105739 A1* | 4/2019 | Ikeno | ................. | B23K 26/0006 |
| 2019/0279867 A1* | 9/2019 | Ikeno | ....................... | C30B 33/02 |
| 2020/0020535 A1* | 1/2020 | Ikeno | ................. | H01L 21/68764 |
| 2020/0230748 A1* | 7/2020 | Ikeno | ................ | B23K 26/0608 |
| 2020/0243343 A1* | 7/2020 | Ikeno | ................ | H01L 21/02019 |

FOREIGN PATENT DOCUMENTS

| | | |
|---|---|---|
| JP | 2011-224658 A | 11/2011 |
| JP | 2014-19120 A | 2/2014 |
| JP | 2015-123466 A | 7/2015 |
| JP | 2016-225536 A | 12/2016 |
| JP | 2017-70961 A | 4/2017 |

* cited by examiner (a)

(b)

(a)

(b)

(a)

(b)

(a)

(b)

(c)

(a)

(b)

(a)

(b)

(c)

(d)

(e)

(a)

(b)

(c)

(d)

(a)

(b)

(c)

(d)

(e)

(a)

(b)

(c)

(d)

(a)

(b)

(c)

(d)

(e)

(a)

(b)

(c)

(d)

(a)

(b)

(c)

(d)

(e)

(a)

(b)

(c)

(d)

(a)

(b)

(c)

(d)

(e)

(a)

(b)

(c)

(d)

(a)

(b)

METHOD FOR MANUFACTURING PEELED SUBSTRATE

This is a National Phase Application filed under 35 U.S.C. 371 as a national stage of PCT/JP2017/038669, filed Oct. 26, 2017, an application claiming the benefit of Japanese Application No. 2017-027121, filed Feb. 16, 2017, the content of each of which is hereby incorporated by reference in its entirety.

TECHNICAL FIELD

The present embodiment relates to a method for manufacturing a peeled substrate, and more specifically, relates to a method for manufacturing a peeled substrate through laser processing for silicon carbide, sapphire, gallium nitride, or the like.

BACKGROUND ART

In order to manufacture semiconductor wafers represented by silicon (Si) wafers, conventionally, semiconductor wafers are manufactured by cutting a columnar ingot obtained by solidifying a silicon melt within a quartz crucible, into a block of proper length, grinding the circumference of the block to a target diameter, and then slicing the block of ingot with wire saws into wafers. In this specification, wafers are properly referred to as substrates if not otherwise specified.

The thus-manufactured semiconductor wafers are sequentially subjected to various types of processing, including formation of a circuit pattern, in the front-end processing and are then supplied to the back-end processing, in which the backside of each wafer is ground for thinning.

Silicon carbide (SiC), which has high hardness and high thermal conductivity, has attracted attentions in recent years. However, silicon carbide is harder than crystalline silicon, and ingots thereof cannot be easily sliced by wire saws. Furthermore, substrates cannot be thinned easily through back grinding. In addition, sapphire substrates and gallium nitride substrates are hard to process and require a proper processing technique.

On the other hand, a technique to form a thin peeled substrate is disclosed, which by using a high numerical aperture condenser lens in combination with an aberration enhancement material composed of a glass plate, projects laser pulses into a wafer to form a processed layer; bonds the wafer to a rigid substrate; and then divides the wafer at the processed layer (see PTL 1).

CITATION LIST

Patent Literature

PTL 1: JP 2014-19120 A

SUMMARY

Technical Problem

However, when the processed layer is formed within a wafer made of a crystalline material, such as SiC, sapphire, or gallium nitride by processing the same with a laser beam in order to form a peeled substrate, such processing is likely to cause cracks along the crystal orientation. It is therefore difficult to stably form the processed layer.

The present embodiment was made in the light of the aforementioned circumstances. An object of the present embodiment is to provide a peeled substrate manufacturing method capable of stably forming a processed layer for separation of a peeled substrate while minimizing occurrence of cracks in the crystalline material.

Solution to Problem

To solve the aforementioned problem, a manufacturing method for a peeled substrate according to an aspect of the present embodiment includes: a substrate processing step of forming a processed layer in a substrate made of a crystal substrate, the step including: a laser light focusing step of projecting laser light from a laser light source for pulse irradiation through a laser light condenser toward a surface of the substrate and focusing the laser light at a predetermined depth from the surface of the substrate within the substrate; and a positioning step of moving the laser light condenser relative to the substrate for positioning. The method further includes a substrate separation step of dividing at the processed layer, the substrate with the processed layer formed by the substrate processing step to produce a peeled substrate. The laser light focusing step includes a laser light adjustment step of, by using a diffractive optical element configured to split the laser light from the laser light source into a plurality of split laser beams, splitting the laser light into the plurality of split laser beams so that at least one of the plurality of split laser beams has a different intensity from that of the other split laser beams. The processed layer is extended by the split laser beam of relatively high intensity among the plurality of split laser beams for processing the substrate while being prevented by the split laser beam of relatively low intensity from extending.

In the laser light adjustment step, the plurality of split laser beams may be arranged in a row, in multiple rows, or in a pattern within the substrate.

In the laser light adjustment step, at least one of the plurality of split laser beams that is located at an end may have an intensity lower than that of the other split laser beams.

In the laser light adjustment step, preferably, the ratio in intensity of the split laser beam of relatively high intensity to the split laser beam of relatively low intensity is in a range from 1.1 to 5.0.

The positioning step may move the laser light condenser at a predetermined speed on the surface of the substrate, in a scanning direction which is at a predetermined angle to the direction of the row, multiple rows, or pattern.

The positioning step may repeat in combination, an operation to move the laser light condenser at a predetermined speed in the scanning direction on the surface of the substrate and an operation to shift the laser light condenser by a predetermined distance in the orthogonal direction to the scanning direction.

The peeled substrate manufacturing method may further include an etching step of etching the peeled substrate with fused alkali as an etching liquid while moving on the peeled substrate, the interface position of the fused alkali on the peeled substrate.

The fused alkali may be molten sodium hydroxide.

The etching may be performed with the fused alkali being flown.

The substrate may be an SiC substrate so that the peeled substrate is made of SiC.

Effects

According to the present embodiment, it is possible to provide a peeled substrate manufacturing method capable of stably forming a processed layer for separation of a peeled substrate while minimizing occurrence of cracks in the crystalline material.

DESCRIPTION OF EMBODIMENTS

Figure 1:
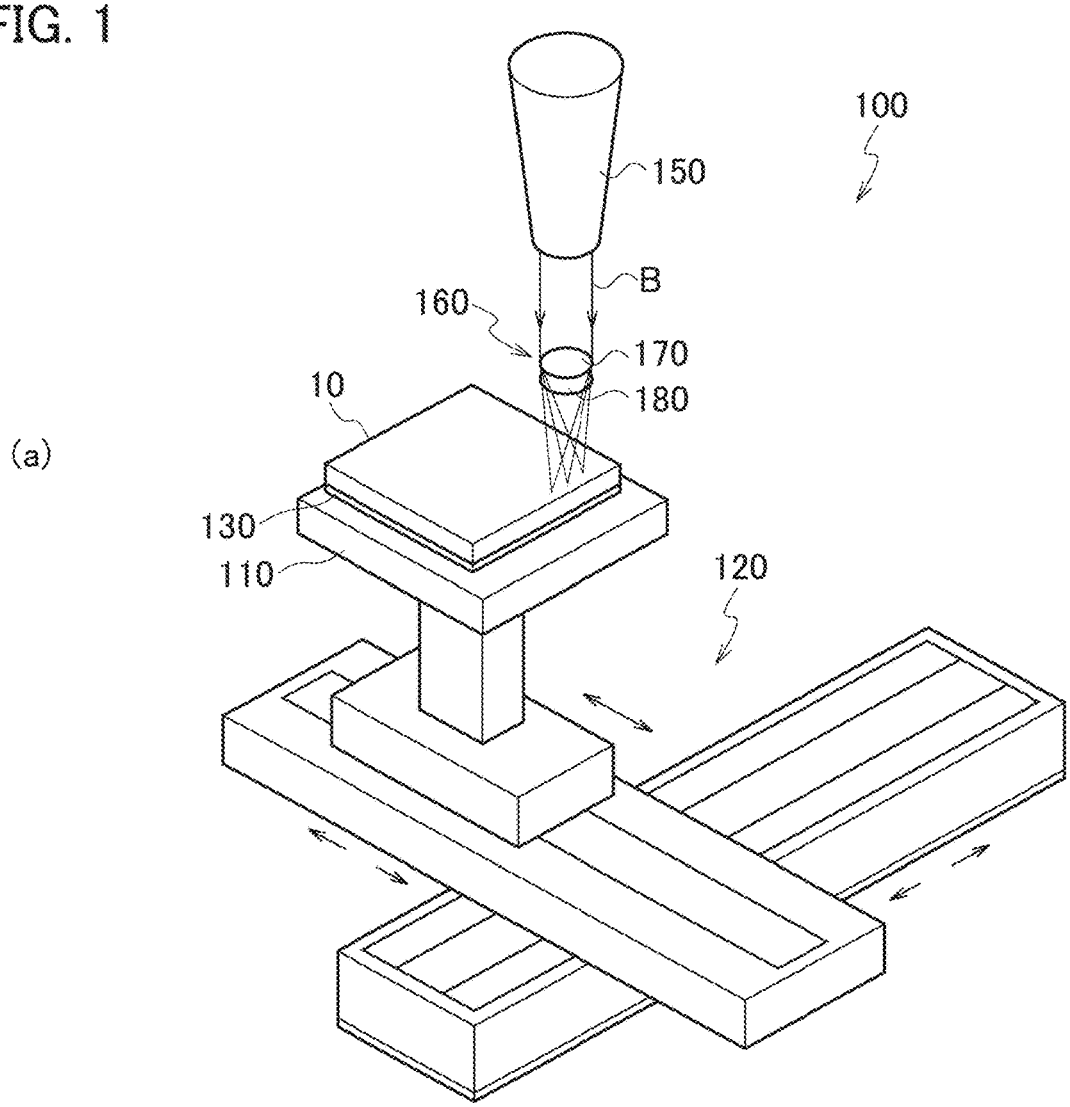
FIG. 1 illustrates an embodiment, FIG. 1(a) being a perspective view of a substrate processing apparatus, and FIG. 1(b) being a plan view illustrating a substrate placed on a stage and processed with laser light.
Figure 1:
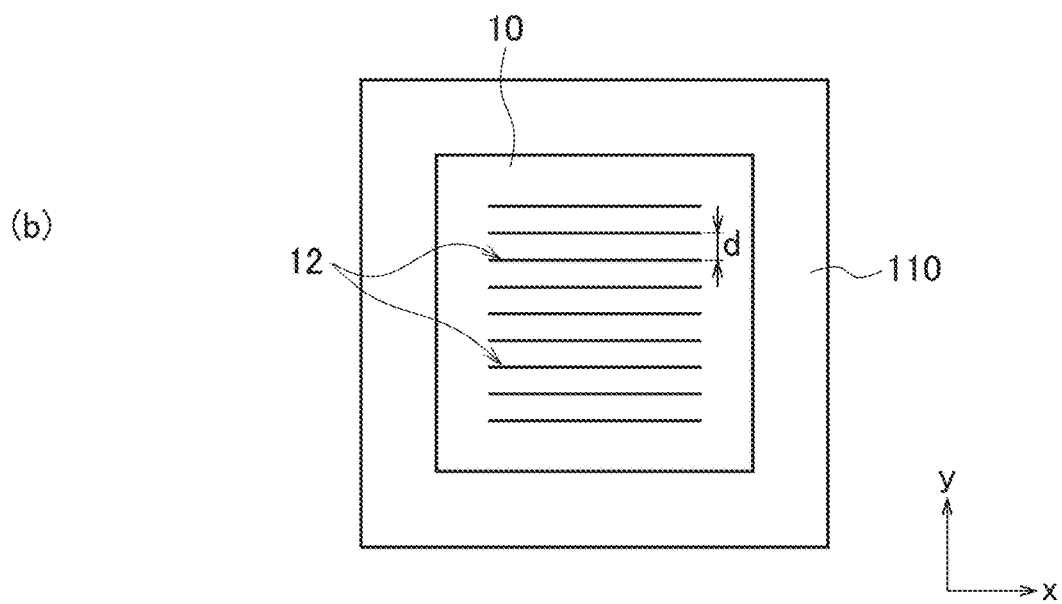

Hereinafter, a description is given of the present embodiment with reference to the accompanying drawings. In the following description, the same or similar constituent elements to those already described are given the same or similar reference numerals, and the detailed description thereof is properly omitted. The embodiment illustrated below is illustrated for embodying the technical idea of the present embodiment. The present embodiment will not specify the materials, shapes, structures, arrangements, and the other properties of the constituent components to those described below. The present embodiment can be variously changed without departing from the scope of the present embodiment FIG. 1 illustrates the configuration of the present embodiment. FIG. 1(a) is a perspective view illustrating the configuration of a substrate processing apparatus 100 of the present embodiment, and FIG. 1(b) is a plan view illustrating a substrate placed on a stage and processed with laser light. The substrate processing apparatus 100 used in the present embodiment (hereinafter, referred to as the embodiment) includes: a stage 110; a stage support section 120, which is configured to support the stage 110 so that the stage 110 moves in X and Y directions; and a substrate fixture 130, which is placed on the stage 110 and fixes the substrate 10. The substrate 10 can be a silicon carbide (SiC) wafer, that is a crystalline material cut off from an ingot.

The substrate processing apparatus 100 includes: a laser light source 150; and a laser light focusing section 160 (a laser light condenser) configured to focus laser light B emitted from the laser light source 150 and project the laser light B to the substrate 10. The laser light focusing section 160 includes a diffractive optical element (DOE) 170 and an objective lens 180.

The diffractive optical element 170 splits the incident laser light B into a predetermined number of split laser beams. The split laser beams are provided so as to be focused by the objective lens 180 and be arranged in a row at the focal position of the laser light focusing section 160. In the drawing, the diffractive optical element 170 produces three split laser beams, but the disclosure is not limited thereto. The split laser beams need to include plural (two or more) split laser beams.

The diffractive optical element 170 adjusts intensities of the plural split laser beams to different values. Herein, adjusting intensities of the plural split laser beams to different values means splitting the laser light B into plural split laser beams at least one of which differs in intensity from the others. As an appropriate case thereof, in the process of splitting the laser light B into three split laser beams, two of the split laser beams have the same intensity while the other one has a different intensity from that of the two split laser beams. Alternatively, adjacent split laser beams are different in intensity.

In the embodiment, the intensity ratio of a relatively high-intensity split laser beam among the plural split laser beams to a relatively low-intensity split laser beam can be set to 1.1 to 5.0. The intensity ratio is preferably in a range from 1.2 to 3.0, more preferably in a range from 1.5 to 2.5, and still more preferably in a range from 1.8 to 2.2.

In this embodiment, the intensities of plural split laser beams formed by the diffractive optical element 170 are adusted to different values so as to control occurrence of cracks due to formation of processing traces within the substrate 10. Specifically, the relatively high-intensity split laser beam among the plural split laser beams forms a separable processed state in which cracks are extended (developed) at right angles to the direction that the laser beam is projected. The comparatively low-intensity split laser beam forms a processed layer in which cracks do not extend, which serves as a stopper to prevent cracks formed by the high-intensity split laser beams from unintentionally extending (developing) along the crystal orientation.

Figure 2:
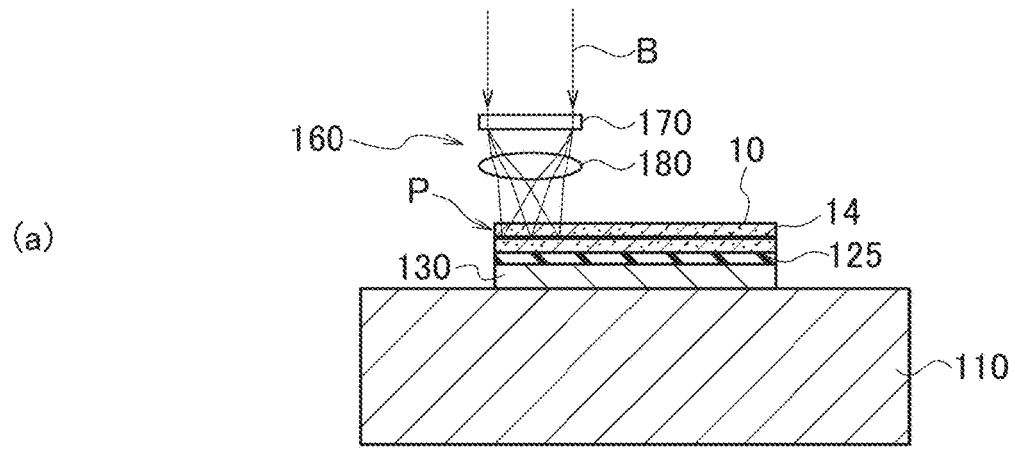
FIG. 2 illustrates the embodiment, FIG. 2(a) being a schematic side cross-sectional view for explaining processing for the substrate placed on the stage with laser light, and FIG. 2(b) being a side cross-sectional view for explaining formation of a processed layer in the substrate.
Figure 2:
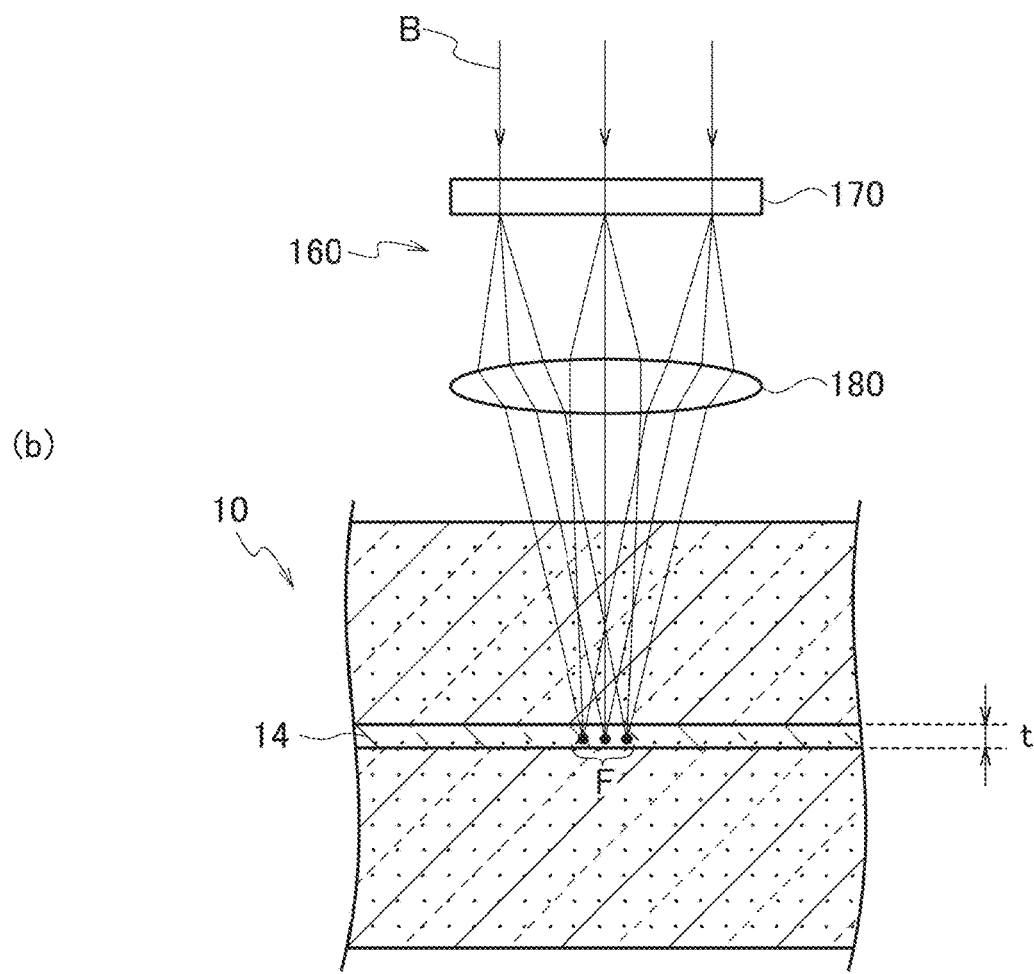

In FIG. 2, FIG. 2(a) is a schematic side cross-sectional view for explaining processing for a substrate placed on a stage with a laser beam, and FIG. 2(b) is a side cross-sectional view for explaining formation of a processed layer in the substrate.

The substrate 10 is held on the stage 110 by the substrate fixture 130. The substrate fixture 130 fixes the substrate 10 through a fixing table 125, that is provided on the substrate fixture 130. The fixing table 125 can be a normal adhesive layer, a mechanical chuck, an electrostatic chuck, or the like.

The laser light B focused and projected onto the substrate 10 forms focusing points F at a predetermined depth from the surface of the substrate 10 (a laser beam focusing step) to form processing traces 12 of a predetermined shape at the predetermined depth from the surface of the substrate 10. In the embodiment, the processing traces 12 are rows which are formed continuously as the stage 110 moves, that is, the substrate 10 moves. Such processing traces 12 are formed in a predetermined pattern within the substrate 10 by moving and positioning the laser light focusing section 160 relatively to the substrate 10 held by the stage 110 (a positioning step).

For example, the operation of moving the focusing points F at a predetermined speed in a predetermined scanning direction is performed in combination with the operation of shifting the focusing points F in the direction at a predetermined angle θ (see FIG. 4) to the scanning direction (90° (the direction orthogonal to the scanning direction) or 45°, for example) by a predetermined distance d (see FIG. 1(b)). This process is repeated to form a processed layer 14 in which the linear processing traces 12 are arranged in a two-dimensional manner.

Substrate Processing Step

In the substrate processing apparatus 100, the laser light B is projected to the substrate 10 through the diffractive optical element 170 and objective lens 180 of the laser light focusing section 160, and the split laser beams are focused to respective focusing points F within the substrate 10, where the processing traces 12 are formed.

The laser light focusing section 160 focuses the split laser beams so as to substantially reduce the diameter of each split laser beam in a predetermined depth range t of the substrate 10, to ensure energy density necessary to form the processed layer 14, that is composed of the processing traces 12 connected. In the drawing, the processed layer 14 is formed in the predetermined depth range t, including the focusing points F, by the split laser beams incident on the surface of the substrate 10.

The processed layer 14 is composed of the processing traces 12 formed by the respective split laser beams. The processing traces 12 are connected to each other. The thus-formed processed layer 14 includes a predetermined periodic structure because the split laser beams are adjacent to each other at predetermined intervals.

Figure 3:
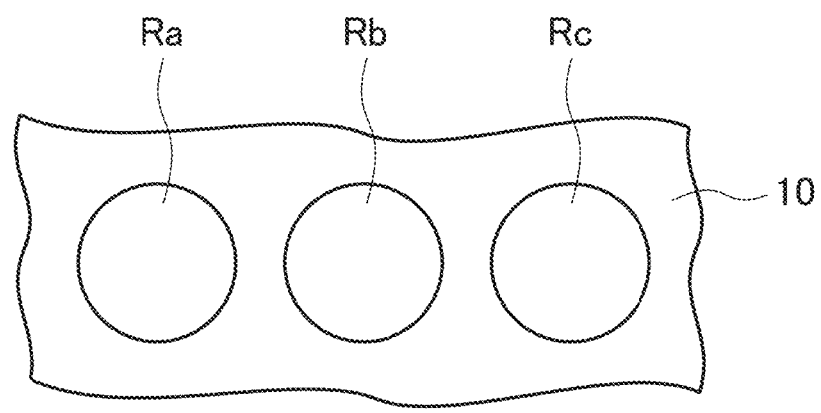
FIG. 3 illustrates the embodiment, FIG. 3(a) being a schematic plan view for explaining three split laser beams projected to the substrate, and FIG. 3(b) being a schematic side cross-sectional view for explaining that the three split laser beams projected onto the substrate are individually focused.
Figure 3:
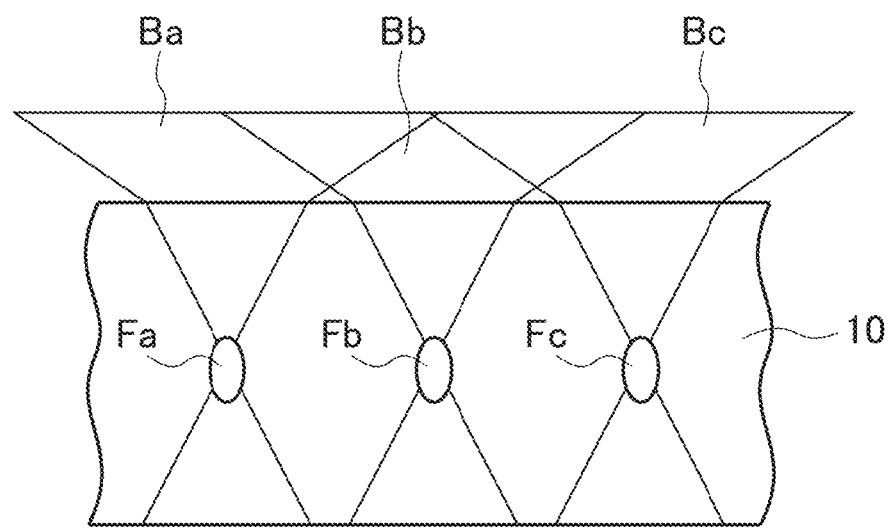

In FIG. 3, FIG. 3(a) is a schematic plan view of the substrate 10, and FIG. 3(b) is a schematic side cross-sectional view for explaining that the three split laser beams projected to the substrate are individually focused. Three split laser beams Ba, Bb, and Bc projected onto the surface of the substrate 10 form three beam spots Ra, Rb, and Rc, which are positioned in a row on the surface of the substrate 10, and enter the substrate 10 to form three focusing points Fa, Fb, and Fc within the substrate 10, respectively. These focusing points Fa, Fb, and Fc form processing traces 12a, 12b, and 12c (see FIG. 4).

The substrate 10 is a crystal substrate of SiC or the like and is subject to cracks along the crystal orientation in the process of forming the focusing points Fa, Fb, and Fc. In the case where the laser light B is split into the three split laser beams Ba, Bb, and Bc, for example, the intensity of the split laser light Bb, which is located in the center, is set higher than that of the split laser beams Ba and Bc, which are located on both sides (at both ends) (a laser light adjustment step), for example. In such a case, even if cracks produced at forming the processing traces 12 by the focusing point Fb, in the center, extend towards the focusing points Fa and Fc on the both sides, the produced cracks are prevented from extending, by the processing traces 12 formed by the focusing points Fa and Fc on the both sides. The intensities of the split laser beams Ba and Bc are set to the minimum values being enough to form processing traces necessary for substrate separation but not so much that the processing traces extend (develop) from the focusing points Fa and Fc along the crystal orientation.

The three split laser beams are set different in intensity from each other so that the intensity ratio of the split laser light Bb, in the center, to the split laser beams Ba and Bc, on both sides, can be in a range of 1.1 to 5.0. This intensity ratio is preferably in a range from 1.2 to 3, more preferably in a range from 1.5 to 2.5, and still more preferably in a range from 1.8 to 2.2.

Figure 4:
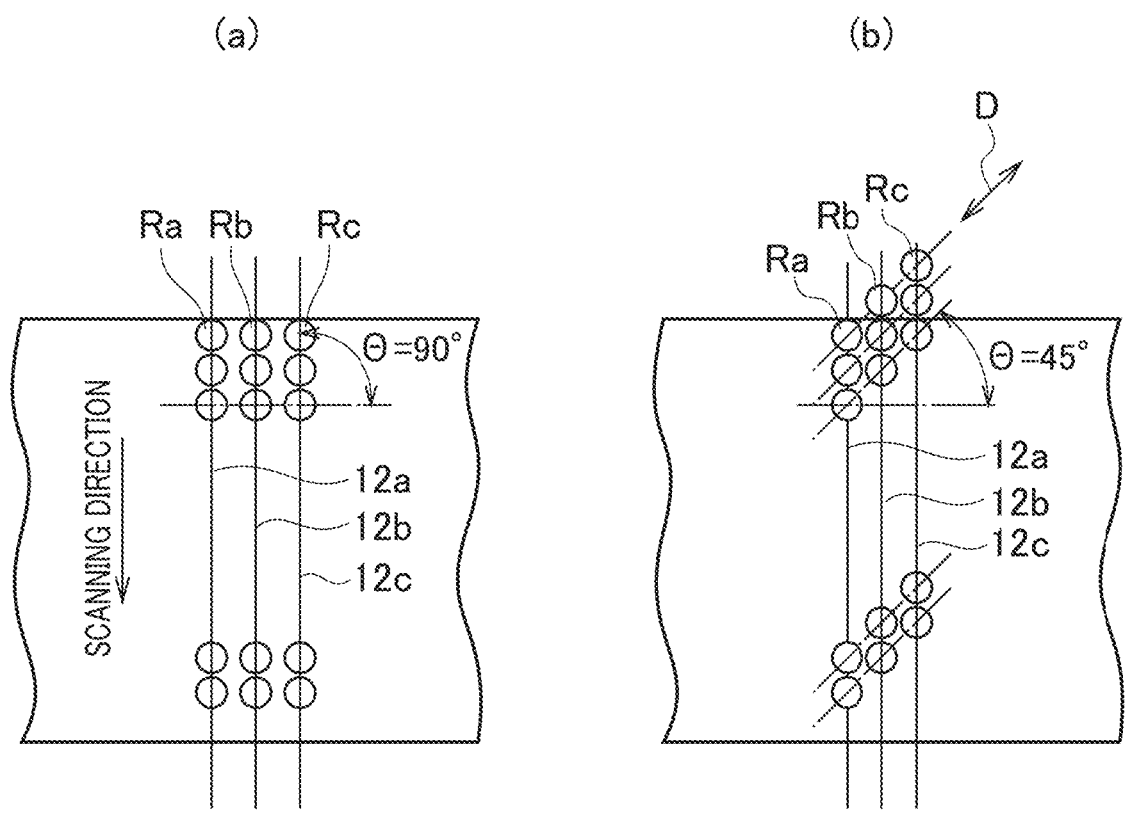
FIG. 4 illustrates schematic plan views for explaining adjustment of intervals between adjacent processing traces.

FIG. 4 illustrates diagrams for explaining adjustment of intervals between the adjacent processing traces 12a to 12c formed in the substrate 10. In the surface of the substrate 10, the three beam spots Ra, Rb, and Rc, which are positioned in a row, are formed by the three split laser beams Ba, Bb, and Bc supplied from the laser light focusing section 16. The three split laser beams Ba, Bb, and Bc are focused through the beam spots Ra, Rb, and Rc to the focusing points Fa, Fb, and Fc within the substrate 10, thus forming processing traces at the focusing points Fa, Fb, and Fc, respectively.

The three beam spots Ra to Rc are moved at a predetermined speed in the predetermined scanning direction. The laser light source 150 supplies laser light pulses, and projection of pulses forms the beam spots Ra to Rc at predetermined intervals in the scanning direction. These intervals in the scanning direction can be properly set.

The intervals between the three processing traces 12a to 12c formed through the beam spots Ra to Rc can be adjusted by controlling the direction of the row in which the three beam spots Ra to Rc are arranged.

FIG. 4(a) illustrates a case where the direction of the row in which the three beam spots Ra to Rc are arranged is set orthogonal to the scanning direction. The distances between the three beam spots Ra to Rc are maximized, in the direction orthogonal to the scanning direction. The intervals between the processing traces 12a to 12c (the intervals between adjacent traces thereof) formed through the three beam spots Ra to Rc are therefore maximized.

FIG. 4(b) illustrates a case where a direction D of the row in which the three beam spots Ra to Rc are arranged is set at a predetermined angle θ with respect to the direction orthogonal to the scanning direction. In FIG. 4(b), the predetermined angle θ is 45° by way of example. The predetermined angle θ is not limited to 45°. The smaller the predetermined angle θ, the shorter the distances between the beam spots Ra to Rc in the direction orthogonal to the scanning direction. The intervals between the processing traces 12a to 12c formed through the three beam spots Ra to Rc therefore become shorter. The state where θ=90°, that is, the predetermined angle is set to 90°, corresponds to the state illustrated in FIG. 4(a).

In this embodiment, the substrate 10 with the processed layer 14 formed therein is cleaved at the processed layer 14, thus producing a peeled substrate (a substrate separation step). Since the processing traces in the processed layer 14 are connected to each other, the substrate 10 can be easily cleaved along the processed layer 14. It is thus possible to stably form the processed layer 14 in the substrate 10 of a silicon carbide (SiC) wafer, that is a crystalline material, with occurrence of cracks minimized.

In this embodiment, a peeled substrate 10p (divided from the silicon carbide wafer) separated at the processed layer 14 is then alkali-etched for mirror finish of a substrate surface 10ps of the peeled substrate 10p (an etching step).

Figure 5:
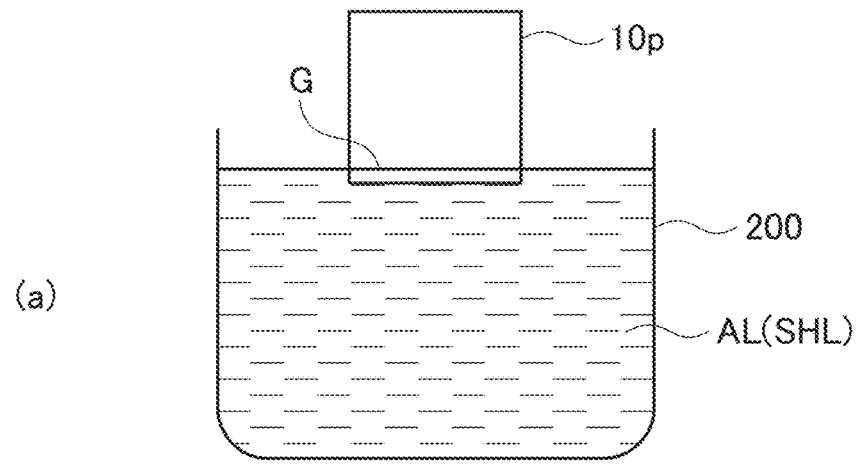
FIGS. 5(a) to 5(c) are schematic front views for explaining a process of sequentially etching a substrate in the present embodiment.
Figure 5:
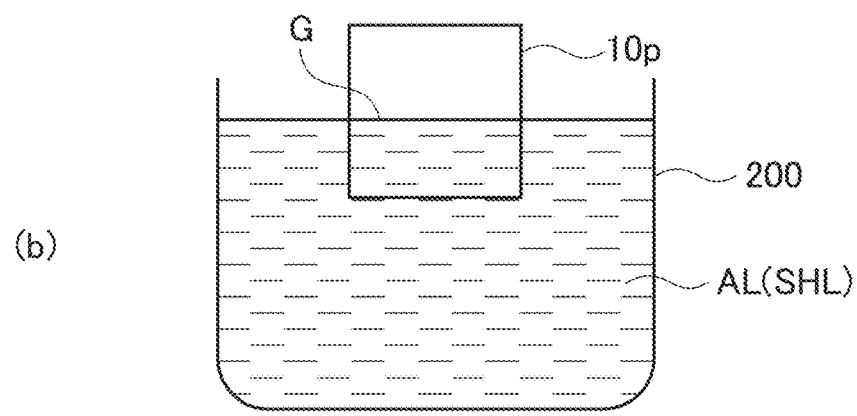
Figure 5:
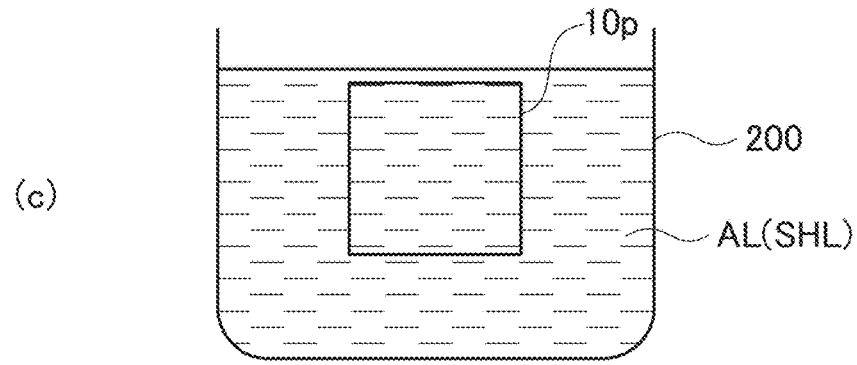
Figure 6:
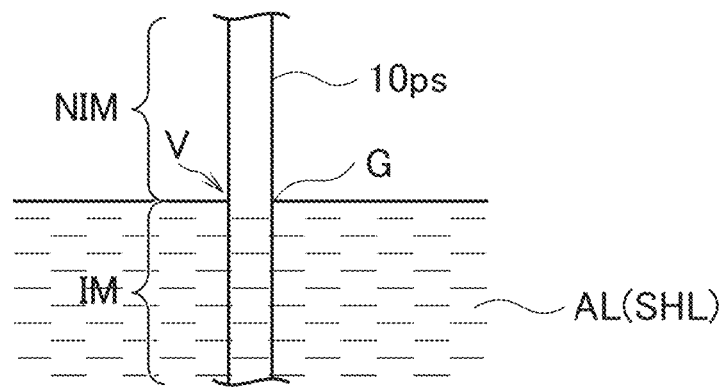
FIG. 6 is a partial enlarged side view of FIG. 5(b).

FIGS. 5(a) to 5(c) are schematic front views for explaining a process of sequentially etching a substrate by an etching method according to an embodiment of the present embodiment (hereinafter, referred to as the embodiment). FIG. 6 is a partial enlarged side view of FIG. 5(b).

In this etching method, the position of the interface of fused alkali on the peeled substrate 10p is moved on the peeled substrate 10p in a gas atmosphere including oxygen. In the embodiment, the peeled substrate 10p is gradually moved down at a constant speed from above to be immersed in fused alkali AL in a vessel 200 (see FIGS. 5(a) to 5(c)). An interface position G of the fused alkali AL on the peeled substrate 10p (the position of the liquid level of the fused alkali Al) therefore sequentially moves from the bottom of the substrate toward the top thereof. Herein, as illustrated in FIGS. 5 to 6, the interface position G in the specification is the same as the position of the liquid level of the fused alkali AL.

During the etching reaction, oxygen in the gas atmosphere is absorbed to promote oxidation for good etching at high speed in an interface vicinity V of a non-immersed section NIM of the peeled substrate 10p. When the interface position G of the fused alkali AL on the peeled substrate 10p is sequentially moved toward the top of the peeled substrate 10p, therefore, it is possible to form a good mirror surface across a wide area of the substrate surface 10ps at high speed even in the peeled substrate 10p made of SiC (silicon carbide), which is a high-hardness and difficult-to-process material.

To be more specific, in the boundary region of the liquid level, the fused alkali climbs the SiC surface due to surface tension and forms a thin film of fused alkali liquid. This film is thin and easily supplies oxygen in air to the SiC surface to activate oxidation. The oxide film is then removed by the fused alkali. This cycle is repeated actively. Mirror finishing (isotropic etching) is thereby promoted efficiently.

The aforementioned process enables formation of a good mirror surface across the entire peeled substrate 10p in a significantly short time compared with dipping the entire peeled substrate 10p in the fused alkali AL (the whole substrate corresponds to the immersed section).

The descent speed of the peeled substrate 10p is determined depending on the type of fused alkali, the temperature, the oxygen concentration of the gas atmosphere, and the like so as to implement good etching.

The aforementioned etching may be isotropic etching. For isotropic etching, the rate of oxidation of the peeled substrate 10p is set higher than the rate of dissolution of the oxide layer to prevent the substrate material (SiC) not yet oxidized from being etched. Even if the substrate material includes a defect (a crystal defect), therefore, the defect is etched after being oxidized, that is, after becoming an oxide layer. The peeled substrate 10p is thus isotropic-etched.

Alternatively, the peeled substrate 10p may be entirely dipped into the fused alkali AL and then gradually pulled up from the fused alkali AL at a constant speed so that the interface position G of the fused alkali AL (the position of the liquid level of the fused alkali AL) on the peeled substrate 10p is sequentially moved toward the bottom of the substrate 10p. This allows for high speed formation of a good mirror surface across a wide range of the substrate surface 10ps of the peeled substrate 10p.

The fused alkali can be molten sodium hydroxide (NaOH), molten potassium hydroxide (KOH), or the like. For etching of Si plane, the fused alkali is preferably molten sodium hydroxide SHL (see FIGS. 5 to 6) from the viewpoint of efficient removal of the Si plane (higher etching rate) for mirror finishing. In this case, using molten sodium hydroxide heated to 650° C. or higher easily implements the aforementioned good etching at high speed. When the temperature is lower than 650° C., the etching rate tends to be low.

For etching C plane, not Si plane, the fused alkali is preferably molten potassium hydroxide from the viewpoint of efficient removal (higher etching rate) of C plane for mirror finishing.

Etching may be performed while the fused alkali AL is flown. This prevents the fused alkali deteriorated by etching from remaining around the substrate surface 10ps.

Modification

Figure 7:
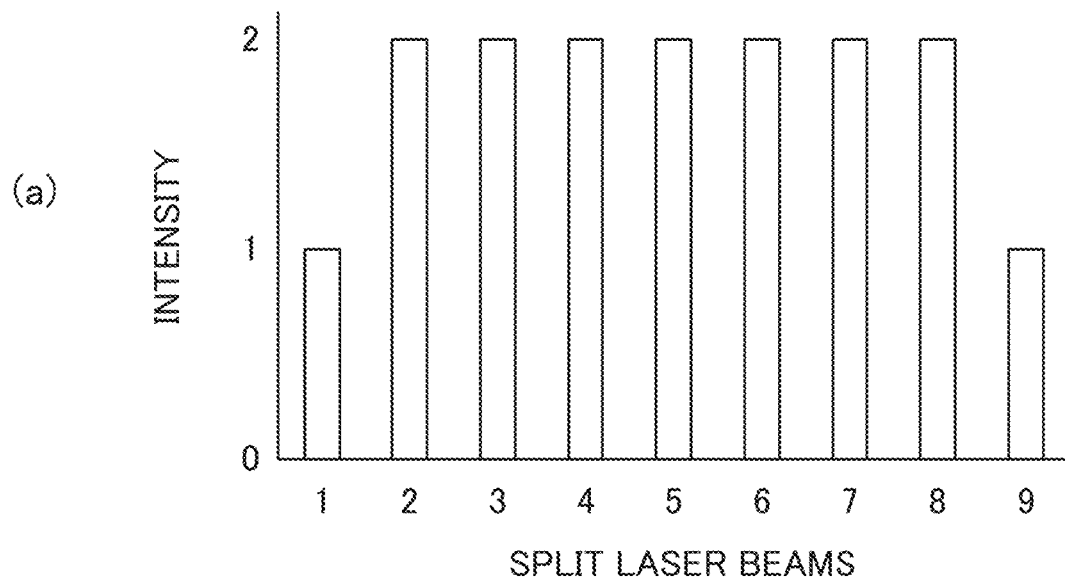
FIG. 7 illustrates graph diagrams illustrating examples of the intensity distribution of plural split laser beams in modifications of the present embodiment.
Figure 7:
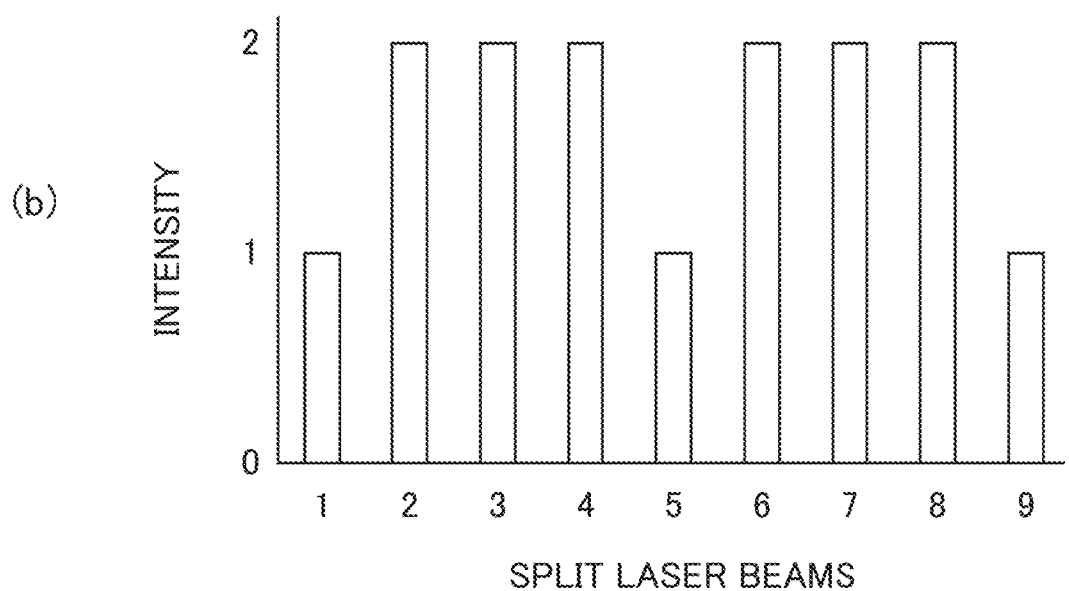

The aforementioned embodiment illustrates the three split laser beams as an example of the plural split laser beams. However, the present embodiment is not limited thereto. The plural split laser beams need to include at least two split laser beams which are different in intensity. For example, as illustrated in FIG. 7, the plural split laser beams may include nine split laser beams. The plural split laser beams are arranged in a row. In FIG. 7(a), the split laser beams at both ends have a low intensity while the split laser beam in the center has a higher intensity than that of the split laser beams at both ends. In FIG. 7(b), the laser beams at both ends and in the center have a lower intensity. For stabilizing the processed layer, that will affect separation, the plural split laser beams preferably include split laser beams of the same intensity.

In the aforementioned embodiment, the plural split laser beams are positioned in a row within the substrate by way of example. The present embodiment is not limited thereto. The plural split laser beams may be arranged in plural rows or in a pattern within the substrate. Any arrangement in a row, plural rows, or a pattern allows for formation of a uniform processed layer. It is therefore possible to form the processed layer stably with occurrence of cracks minimized.

Figure 8:
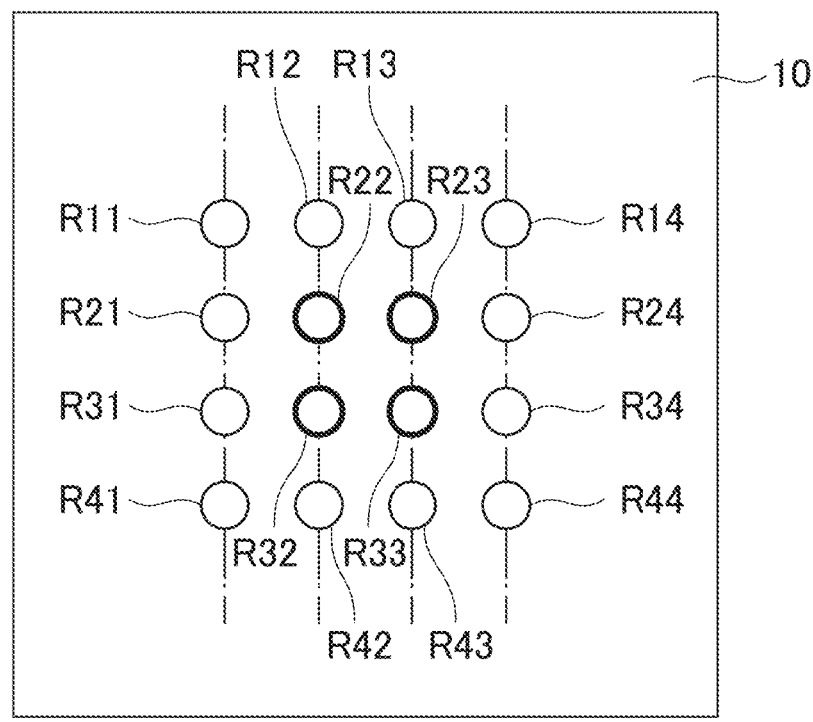
FIG. 8 is a schematic plan view for explaining an example of the plural split laser beams arranged in plural rows or a pattern in a modification of the present embodiment.

FIG. 8 is a schematic plan view illustrating an example of the state where the beam spots of the split laser beams projected onto the substrate 10 are positioned in plural rows or in a pattern. The split laser beams form, in the direction orthogonal to the scanning direction (illustrated by dashed and dotted lines in FIG. 8): four beam spots R11, R12, R13, and R14 in the first row; four beam spots R21, R22, R23, and R24 in the second row; four beam spots R31, R32, R33, and R34 in the third row; and four beam spots R41, R42, R43, and R44 in the fourth row.

These beam spots form an arrangement of plural rows including totally four rows from the first to fourth rows. Furthermore, the beam spots form a pattern of four rows in the scanning direction and four rows in the direction orthogonal to the scanning direction, including totally 16 (=4×4) beam spots. The four beam spots R22, R23, R32, and R33 in the center, among the plural beam spots, are of high intensity than the other beam spots R11 to R14, R21, R24, R31, R34, and R41 to R44, that surround the four beam spots R22, R23, R32, and R33. The intensity ratio of the center four beam spots to the other beam spots may be 1.1 to 5.0, for example.

The plural rows formed by beam spots need to include two or more rows. The pattern of beam spots needs to be a particular pattern formed by three or more beam spots.

EXAMPLE AND EXPERIMENTAL EXAMPLE

Hereinafter, Examples (Examples of the embodiment described using FIGS. 1 to 6) and Experimental Examples are described.

Example 1

In Example 1, the laser light source 150 of the substrate processing apparatus 100 was a laser oscillator HALO GN 35k-100 made by InnoLight Technology Corporation. The laser light source 150 is capable of supplying the laser light B illustrated in Table 1.

TABLE 1

| WAVELENGTH | 515 nm |
|---|---|
| PULSE ENERGY | 100 μJ |
| REPETITION FREQUENCY | 35 kHz |
| MAXIMUM AVERAGE OUTPUT | 3.5 W |
| PULSE WIDTH | 1.5 ns |
| M2 (BEAM QUALITY FACTOR) | About 1.3 |

The diffractive optical element 170 was a diffractive optical element made by Furukawa Co., Ltd, which splits the laser light B into the three split laser beams Ba, Bb, and Bc with an intensity ratio of 1/2/1. The objective lens 180 was LCPLN 100×IR.

The substrate 10 was a SiC substrate of 4H crystal structure with the surface mirror-finished. To reveal the property of the processing traces 12, the substrate 10 was processed under the conditions illustrated in Table 2. In Table 2, "DOE ANGLE" indicates an angle of the direction of the row in which the three beam spots Ra, Rb, and Rc are positioned with respect to the orthogonal direction to the scanning direction. "FOCAL DEPTH" indicates the depth of the focuses corresponding to the focusing points F from the surface of the substrate 10.

TABLE 2

| DOE ANGLE | 0° |
|---|---|
| OUTPUT | 233 mW |
| SCANNING SPEED | 10 mmps |
| IRRADIATION INTERVAL | 0.29 μm |
| FOCAL DEPTH | SLIGHTLY SHALLOWER THAN 100 μm |

Figure 9:
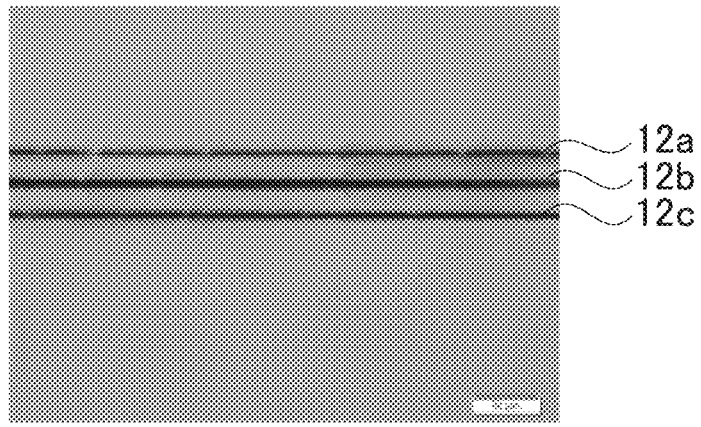
FIG. 9(a) is a micrograph diagram illustrating processing traces formed within a substrate by laser beams in Example 1.
FIG. 9(b) is a partial enlarged diagram of FIG. 9(a).
Figure 9:
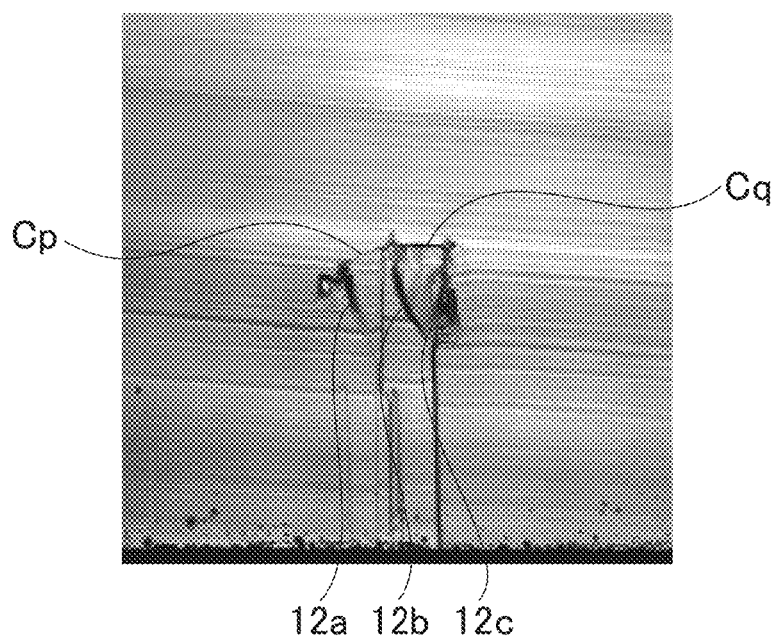

FIG. 9 illustrates micrographs illustrating the processing traces 12a to 12c formed in the substrate 10 by the aforementioned processing. FIG. 9(a) illustrates the three processing traces 12a to 12c formed through the three beam spots Ra to Rc, as observed from the top surface of the transparent SiC substrate 10. Herein, the diffractive optical element 170 produced the three split laser beams Ba, Bb, and Bc with an intensity ratio of 1/2/1. The processing trace 12b in the center was a little thick while the processing traces 12a and 12c on both sides were a little thin.

FIG. 9(b) illustrates the processing traces 12, including the three processing traces 12a to 12c, formed in the substrate 10, as observed in a cross section that is substantially vertical to the direction that the processing traces 12 extended. Herein, cracks extended (developed) from the processing traces laterally. Cracks Cp and Cq that extended (developed) from the processing trace 12b in the center respectively reached the processing traces 12a and 12c on both sides but were stopped at the processing traces 12a and 12c on both sides. This has revealed that these three processing traces 12a to 12c were connected to each other by the cracks Cp and Cq while the cracks Cp and Cq were prevented from further extending (developing).

Example 2

Next, after the processed layer 14 was created by the processing traces 12 formed across the entire substrate 10, and the substrate 10 was cleaved at the processed layer 14, thus producing peeled substrates. The property of separation planes of the peeled substrates was then examined. In Example 2, the processed layer 14 was formed under the conditions illustrated in the fields of Example 2 in Table 3. Example 2 was subjected to the same conditions as those in Example 1 except the conditions illustrated in Table 3. For example, the substrate 10 was a polycrystal SiC substrate of 4H crystal structure, and the diffractive optical element 170 was configured to produce three split laser beams. Table 3 illustrates the conditions for Examples 3 to 6 (described later) together.

TABLE 3

| EXAMPLE | DOE ANGLE (°) | OUTPUT (mW) | SCANNING SPEED (mmps) | IRRADIATION TIME (μm) | REPETITION FREQUENCY (μm) | SEPARATION (%) |
|---|---|---|---|---|---|---|
| 2 | 0 | 300 | 10 | 0.29 | 60 | 90 |
| 3 | 0 | 160 | 20 | 0.57 | 60 | 50 |
| 4 | 0 | 160 | 30 | 0.86 | 60 | 30 |
| 5 | 0 | 160 | 100 | 2.9 | 60 | 98 |
| 6 | 45 | 160 | 10 | 0.29 | 40 | 10 |

Figure 10:
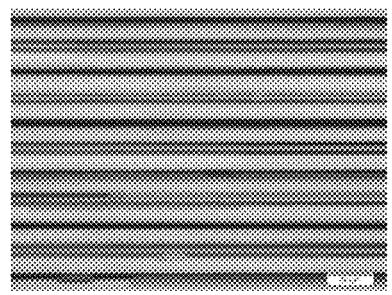
FIG. 10 illustrates photograph diagrams for explaining Example 2.
Figure 10:
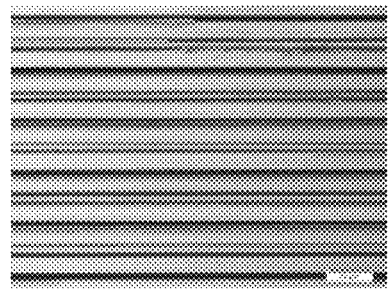
Figure 10:
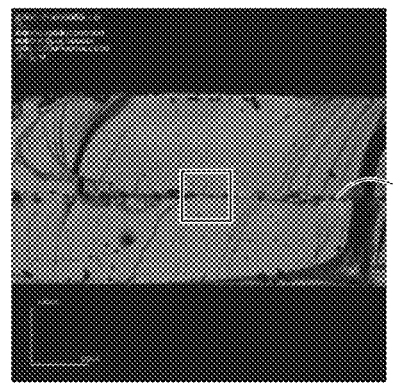
Figure 10:
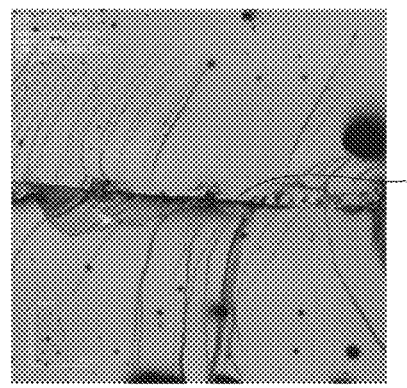
Figure 10:
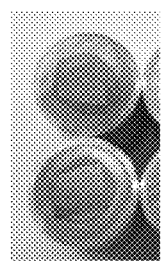

FIGS. 10(a) and 10(b) are micrographs illustrating processing traces formed in the substrate 10 before and after scribing in Example 2, respectively. FIG. 10(c) is a micrograph of a cross section of the substrate 10 observed by a laser microscope, and FIG. 10(d) is an enlarged micrograph of part within the frame of FIG. 10(c).

FIGS. 10(c) and 10(d) demonstrate that the processed layer 14 was formed, which was composed of the processing traces 12 connected in the direction parallel to the surface of the substrate 10, that is, the horizontal direction in the drawings. FIG. 10(e) is a photograph illustrating separation planes of peeled substrates cleaved at the processed layer 14 using a tensile tester. In Example 2, the separation plane of each peeled substrate was formed on 90% of the entire surface thereof.

Subsequently, the separation planes of the peeled substrates were measured in terms of surface roughness. The upper surface on the laser irradiation side, that faces the laser focusing section 160, had a profile illustrated in FIG. 11(a) in terms of Ra (μm) while having a profile illustrated in FIG. 11(b) in terms of Rz (μm). The results of measurement are shown in Table 4. Table 4 illustrates measurements of surface roughness at three points and the average thereof. The same applies to the followings.

The roughness in the scanning direction in Table 4 indicates the roughness in the direction that the laser beams were moved for scanning, and the roughness in the off-set direction indicates the roughness formed between the split laser beams in the direction at 90° to the scanning direction. The same applies to Tables 5 to 7 described later.

Figure 11:
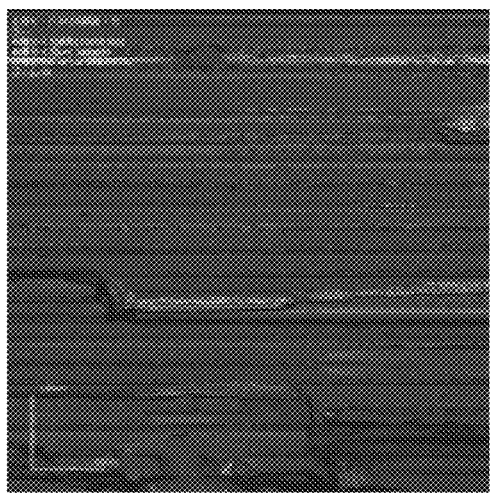
FIG. 11 illustrates photograph diagrams illustrating results of measuring surface roughness in separation planes of Example 2.
Figure 11:
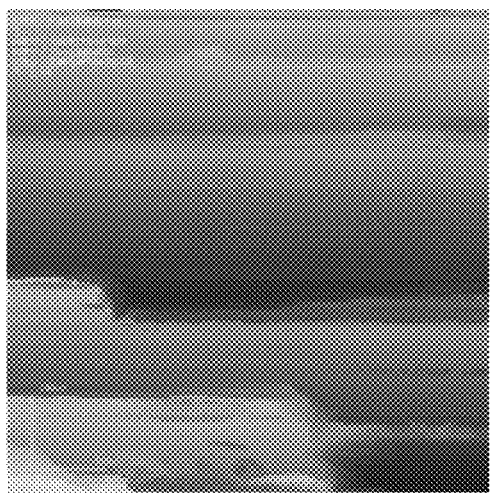
Figure 11:
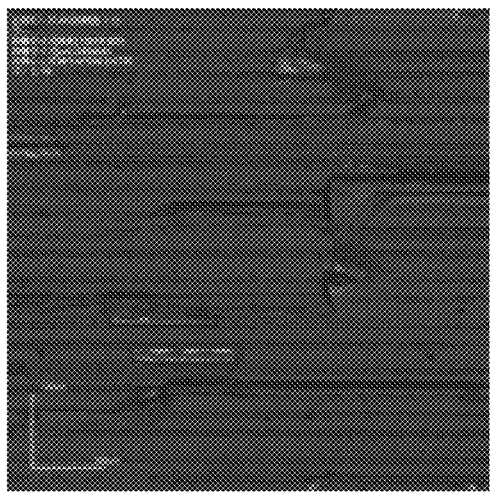
Figure 11:
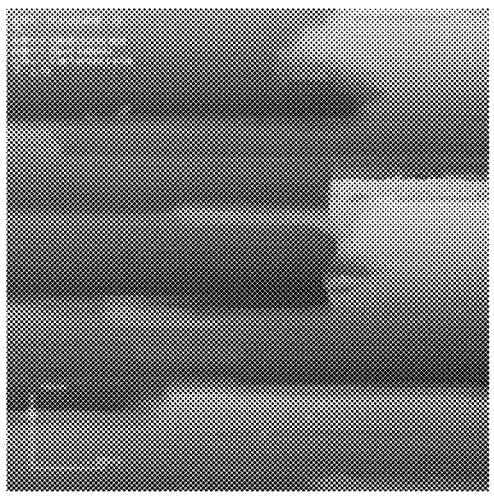

The lower surface on the side placed on the stage 110, had a profile illustrated in FIG. 11(c) in terms of Ra (μm) while having a profile illustrated in FIG. 11(d) in terms of Rz (μm). The results of measurement are shown in Table 5.

TABLE 4

| LASER IRRADIATION SIDE | | | | |
|---|---|---|---|---|
| | Ra/μm | | Rz/μm | |
| SCANNING DIRECTION | 0.052 | 0.06 | 0.806 | 0.94 |
| | 0.100 | | 1.574 | |
| | 0.039 | | 0.429 | |
| OFF-SET DIRECTION | 3.375 | 3.1 | 17.94 | 16.7 |
| | 3.408 | | 18.892 | |
| | 2.424 | | 13.334 | |

| STAGE SIDE | | | | |
|---|---|---|---|---|
| | Ra/μm | | Rz/μm | |
| SCANNING DIRECTION | 1.605 | 1.4 | 9.062 | 7.1 |
| | 2.395 | | 10.071 | |
| | 0.102 | | 2.221 | |
| OFF-SET DIRECTION | 2.090 | 2.5 | 10.445 | 12.8 |
| | 2.314 | | 12.523 | |
| | 3.185 | | 15.544 | |

Example 3

Figure 12:
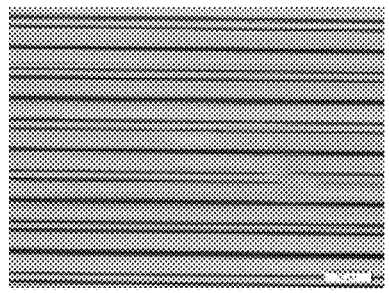
FIG. 12 illustrates photograph diagrams for explaining Example 3.
Figure 12:
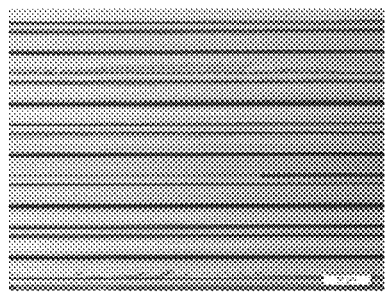
Figure 12:
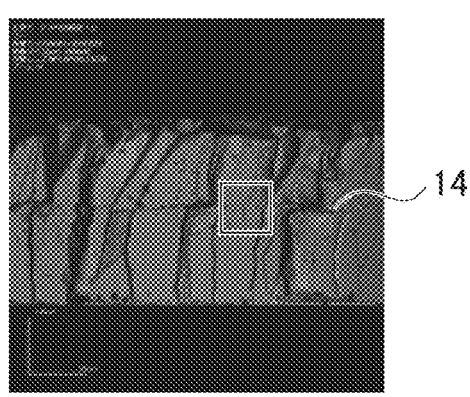
Figure 12:
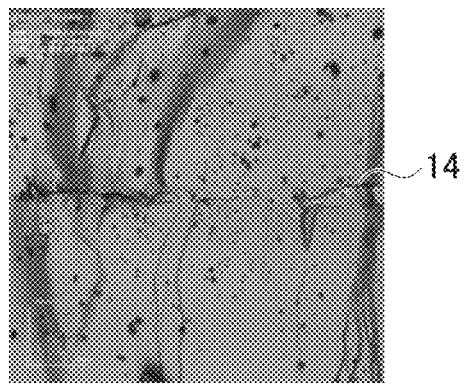
Figure 12:

FIGS. 12(a) and 12(b) are micrographs illustrating processing traces formed in the substrate 10 before and after scribing in Example 3, respectively. FIG. 12(c) is a micrograph of a cross section of the substrate 10 observed by a laser microscope, and FIG. 12(d) is an enlarged micrograph of part within the frame of FIG. 12(c).

In Example 3, the processed layer 14 was formed under the conditions illustrated in the fields of Example 3 in Table 3. Example 3 were subjected to the same conditions as those in Example 2 except the conditions illustrated in Table 3. In Example 3, the separation plane of each peeled substrate was formed on 50% of the entire surface thereof.

Figure 13:
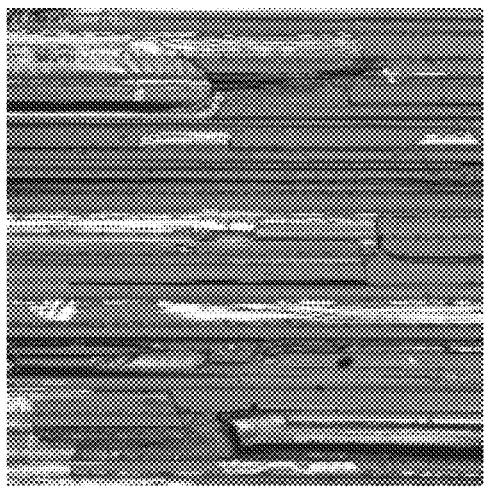
FIG. 13 illustrates photograph diagrams illustrating results of measuring surface roughness in separation planes of Example 3.
Figure 13:
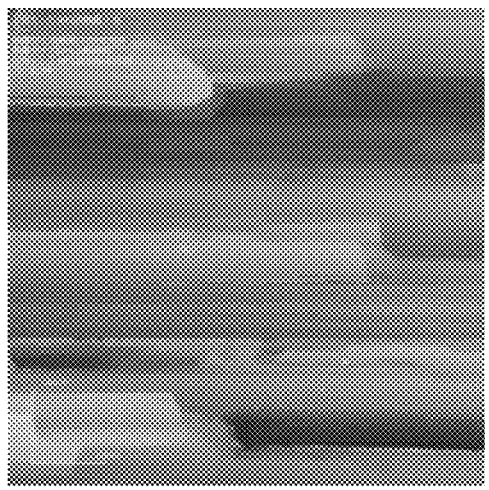
Figure 13:
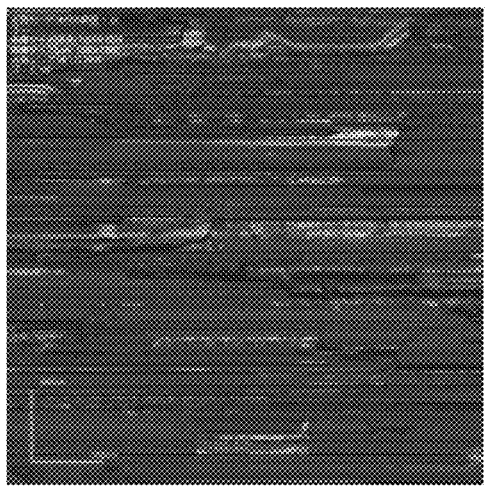
Figure 13:

As for the surface roughness of the separation planes of the peeled substrates, the upper surface on the laser irradiation side had a profile illustrated in FIG. 13(a) in terms of Ra (μm) while having a profile illustrated in FIG. 13(b) in terms of Rz (μm). The results of measurement are shown in Table 6. The lower surface on the stage side had a profile illustrated in FIG. 13(c) in terms of Ra (μm) while having a profile illustrated in FIG. 13(d) in terms of Rz (μm). The results of measurement are shown in Table 7.

TABLE 6

| LASER IRRADIATION SIDE | | | | |
|---|---|---|---|---|
| | Ra/μm | | Rz/μm | |
| SCANNING DIRECTION | 1.881 | 0.74 | 10.84 | 4.5 |
| | 0.044 | | 0.371 | |
| | 0.280 | | 2.319 | |
| OFF-SET DIRECTION | 2.647 | 2.7 | 12.973 | 14.2 |
| | 2.808 | | 14.456 | |
| | 2.577 | | 15.147 | |

TABLE 7

| STAGE SIDE | | | | |
|---|---|---|---|---|
| | Ra/μm | | Rz/μm | |
| SCANNING DIRECTION | 0.401 | 0.33 | 4.306 | 2.8 |
| | 0.105 | | 1.541 | |
| | 0.489 | | 2.455 | |
| OFF-SET DIRECTION | 2.551 | 2.3 | 14.036 | 13.9 |
| | 2.453 | | 14.962 | |
| | 2.003 | | 12.592 | |

Example 4

Figure 14:
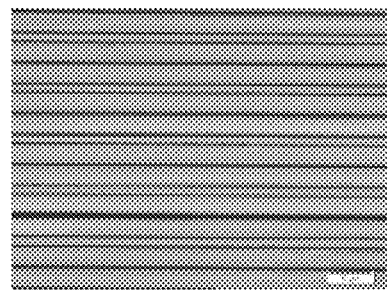
FIG. 14 illustrates photograph diagrams for explaining Example 4.
Figure 14:
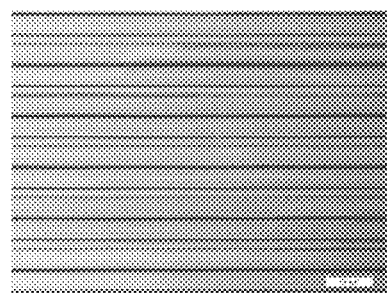
Figure 14:
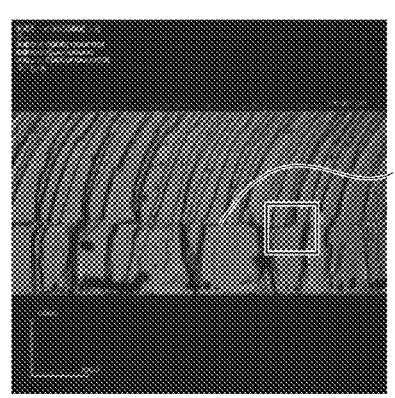
Figure 14:
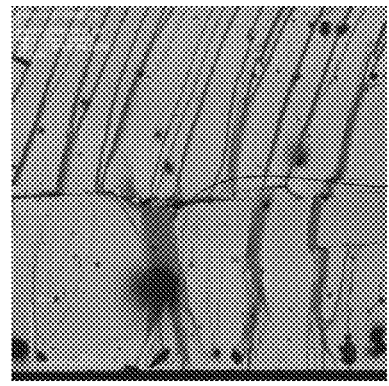
Figure 14:
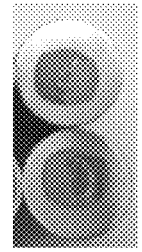

FIGS. 14(a) and 14(b) are micrographs illustrating processing traces formed in the substrate 10 before and after scribing in Example 4, respectively. FIG. 14(c) is a micrograph of a cross section of the substrate 10 observed by a laser microscope, and FIG. 14(d) is an enlarged micrograph of part within the frame of FIG. 14(c).

In Example 4, the processed layer 14 was formed under the conditions illustrated in the fields of Example 4 in Table 3. Example 4 was subjected to the same conditions as those in Example 2 except the conditions illustrated in Table 3. In Example 4, the separation plane of each peeled substrate was formed on 30% of the entire surface thereof.

Figure 15:
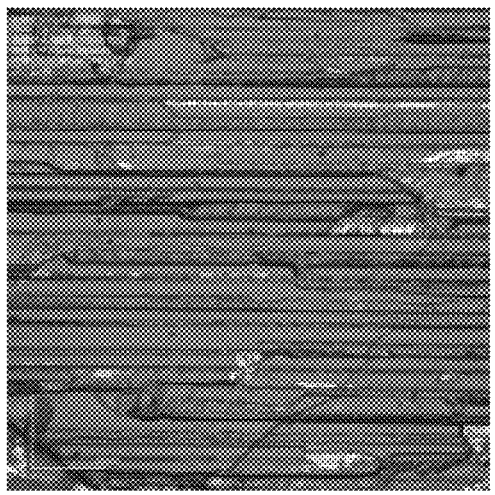
FIG. 15 illustrates photograph diagrams illustrating results of measuring surface roughness in separation planes of Example 4.
Figure 15:
Figure 15:
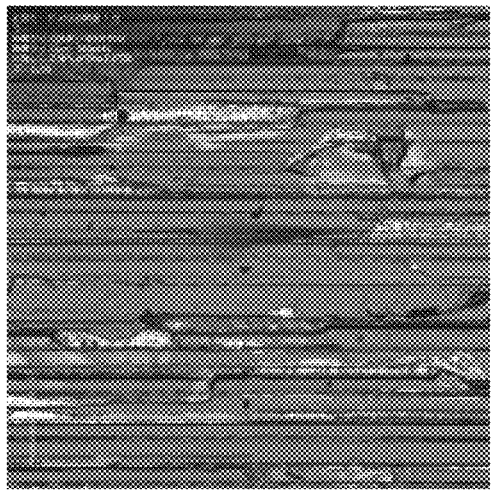
Figure 15:
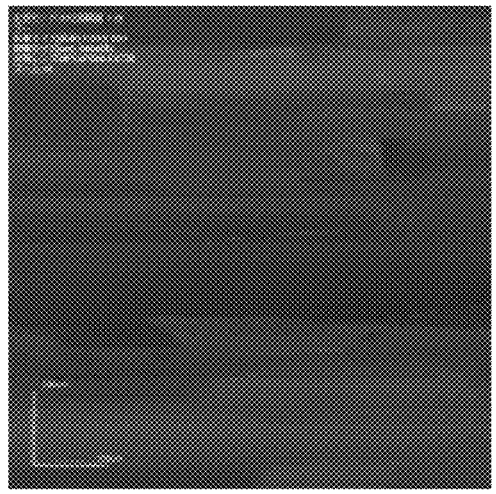

As for the surface roughness of the separation planes of the peeled substrates, the upper surface on the laser irradiation side had a profile illustrated in FIG. 15(a) in terms of Ra (μm) while having a profile illustrated in FIG. 15(b) in terms of Rz (μm). The results of measurement are shown in Table 8. The lower surface on the stage side had a profile illustrated in FIG. 15(c) in terms of Ra (μm) while having a profile illustrated in FIG. 15(d) in terms of Rz (μm). The results of measurement are shown in Table 9.

TABLE 8

| | LASER IRRADIATION SIDE | | | |
|---|---|---|---|---|
| | Ra/μm | | Rz/μm | |
| SCANNING DIRECTION | 0.028 0.641 0.288 | 0.32 | 0.202 2.882 2.57 | 1.9 |
| OFF-SET DIRECTION | 2.041 2.024 2.388 | 2.2 | 14.668 11.922 14.828 | 13.8 |

TABLE 9

| | STAGE SIDE | | | |
|---|---|---|---|---|
| | Ra/μm | | Rz/μm | |
| SCANNING DIRECTION | 0.668 0.032 0.641 | 0.45 | 4.997 1.966 3.985 | 3.6 |
| OFF-SET DIRECTION | 2.437 2.629 2.600 | 2.6 | 12.761 14.809 14.34 | 14.0 |

Example 5

Figure 16:
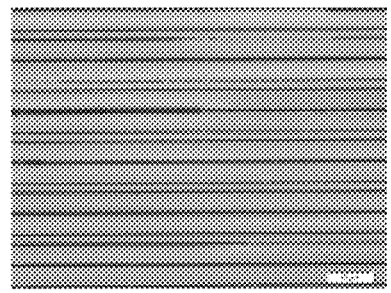
FIG. 16 illustrates photograph diagrams for explaining Example 5.
Figure 16:
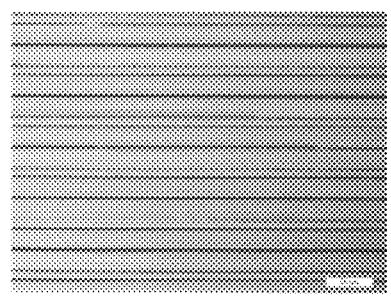
Figure 16:
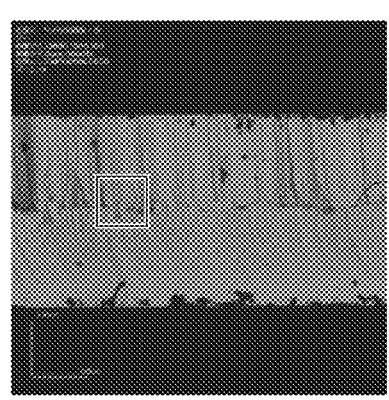
Figure 16:
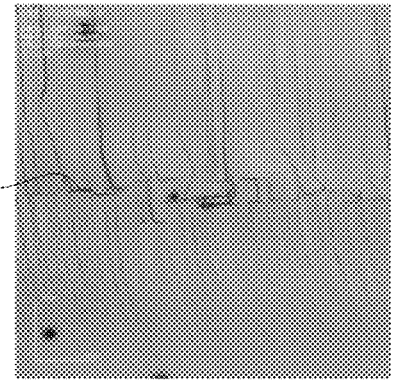
Figure 16:
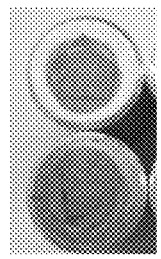

FIGS. 16(a) and 16(b) are micrographs illustrating processing traces formed in the substrate 10 before and after scribing in Example 5, respectively. FIG. 16(c) is a micrograph of a cross section of the substrate 10 observed by a laser microscope, and FIG. 16(d) is an enlarged micrograph of part within the frame of FIG. 16(c).

In Example 5, the processed layer 14 was formed under the conditions illustrated in the fields of Example 6 in Table 3. Example 6 was subjected to the same conditions as those in Example 2 except the conditions illustrated in Table 3. In Example 5, the separation plane of each peeled substrate was formed on 98% of the entire surface thereof.

Figure 17:
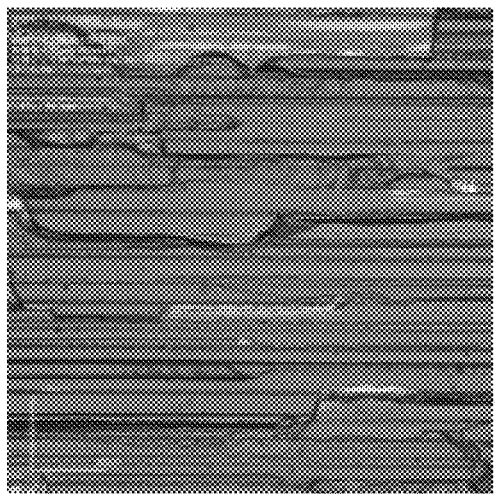
FIG. 17 illustrates photograph diagrams illustrating results of measuring surface roughness in separation planes of Example 5.
Figure 17:
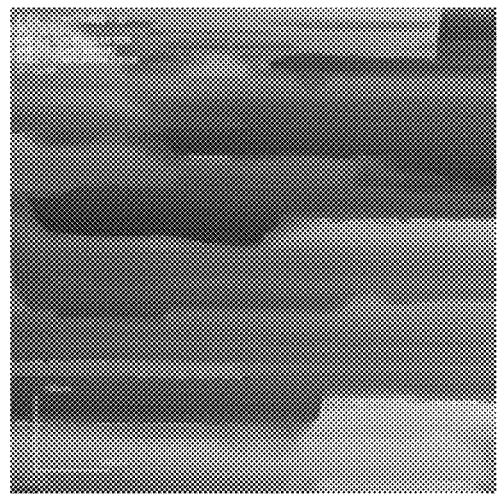
Figure 17:
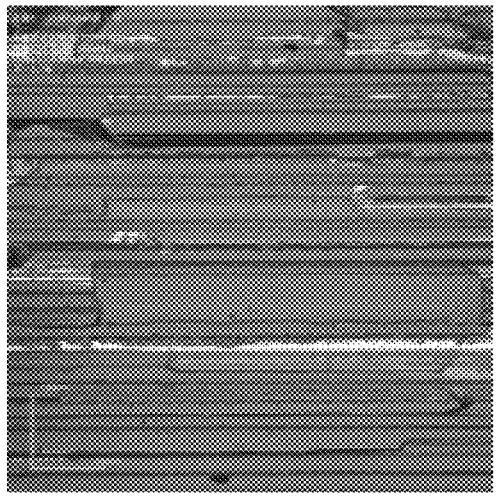
Figure 17:

As for the surface roughness of the separation planes of the peeled substrates, the upper surface on the laser irradiation side had a profile illustrated in FIG. 17(a) in terms of Ra (μm) while having a profile illustrated in FIG. 17(b) in terms of Rz (μm). The results of measurement are shown in Table 10. The lower surface on the stage side had a profile illustrated in FIG. 17(c) in terms of Ra (μm) while having a profile illustrated in FIG. 17(d) in terms of Rz (μm). The results of measurement are shown in Table 11.

TABLE 10

| | LASER IRRADIATION SIDE | | | |
|---|---|---|---|---|
| | Ra/μm | | Rz/μm | |
| SCANNING DIRECTION | 0.943 0.330 0.924 | 0.73 | 3.617 5.281 7.800 | 5.6 |
| OFF-SET DIRECTION | 2.980 3.078 3.296 | 3.1 | 16.343 14.765 17.362 | 16.2 |

TABLE 11

| | STAGE SIDE | | | |
|---|---|---|---|---|
| | Ra/μm | | Rz/μm | |
| SCANNING DIRECTION | 0.501 1.169 0.848 | 0.84 | 2.297 3.984 4.513 | 3.6 |
| OFF-SET DIRECTION | 2.425 3.100 2.794 | 2.8 | 12.945 16.526 15.886 | 15.1 |

Example 6

Figure 18:
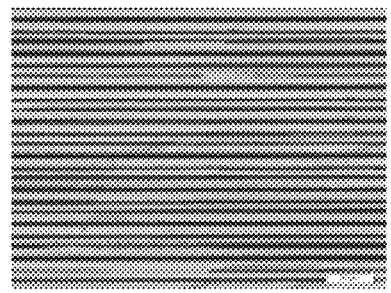
FIG. 18 illustrates photograph diagrams for explaining Example 6.
Figure 18:
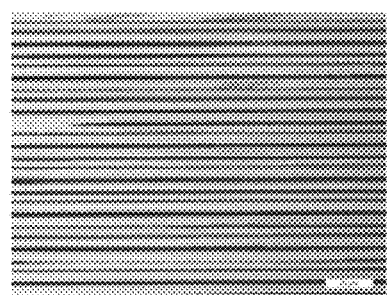
Figure 18:
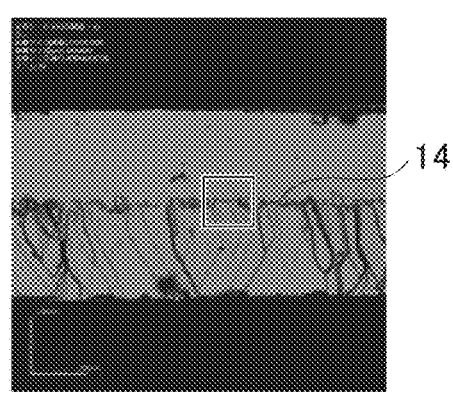
Figure 18:
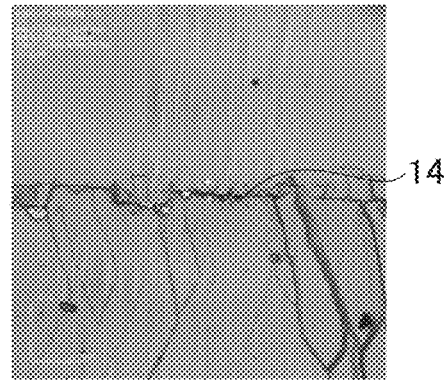
Figure 18:
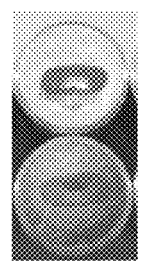

FIGS. 18(a) and 18(b) are micrographs illustrating processing traces formed in the substrate 10 before and after scribing in Example 6, respectively. FIG. 18(c) is a micrograph of a cross section of the substrate 10 observed by a laser microscope, and FIG. 18(d) is an enlarged micrograph of part within the frame of FIG. 18(d).

In Example 6, the processed layer 14 was formed under the conditions illustrated in the fields of Example 6 in Table 3. Example 6 was subjected to the same conditions as those in Example 2 except the conditions illustrated in Table 3. In Example 6, the separation plane was formed on 10% of the entire surface of the peeled substrate.

Figure 19:
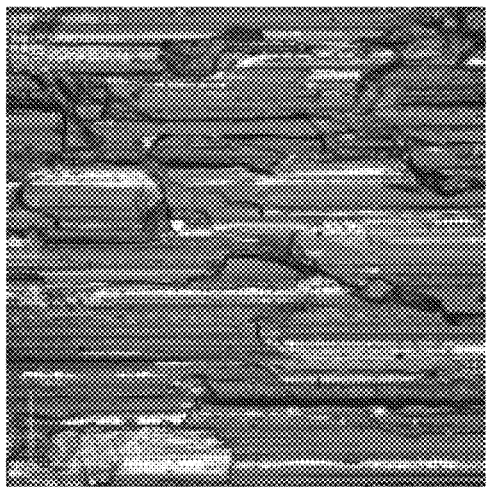
FIG. 19 illustrates photograph diagrams illustrating results of measuring surface roughness in separation planes of Example 6.
Figure 19:
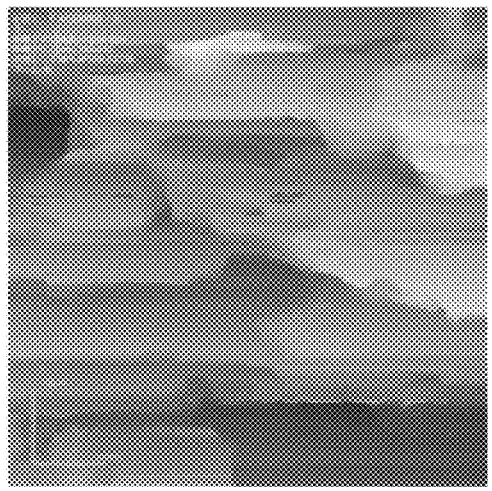
Figure 19:
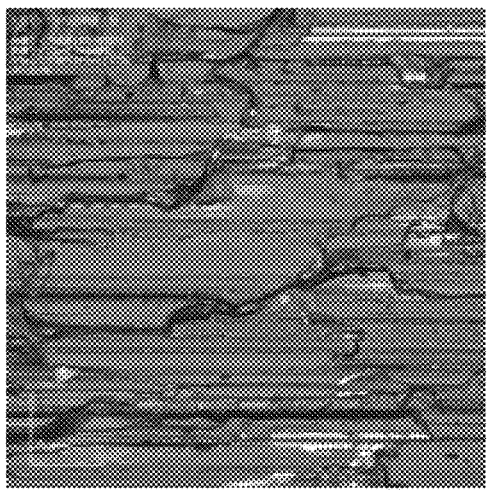
Figure 19:
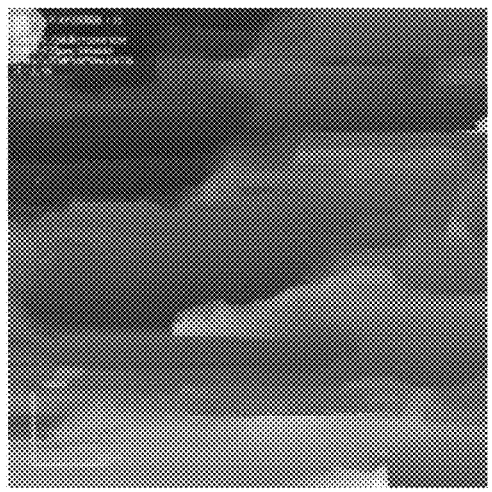

As for the surface roughness of the separation planes of the peeled substrates, the upper surface on the laser irradiation side had a profile illustrated in FIG. 19(a) in terms of Ra (μm) while having a profile illustrated in FIG. 19(b) in terms of Rz (μm). The results of measurement are shown in Table 12. The lower surface on the stage side had a profile illustrated in FIG. 19(c) in terms of Ra (μm) while having a profile illustrated in FIG. 19(d) in terms of Rz (μm). The results of measurement are shown in Table 13.

TABLE 12

| | LASER IRRADIATION SIDE | | | |
|---|---|---|---|---|
| | Ra/μm | | Rz/μm | |
| SCANNING DIRECTION | 2.534 1.261 0.723 | 1.5 | 12.713 6.516 3.594 | 7.6 |
| OFF-SET DIRECTION | 1.478 2.575 3.514 | 2.5 | 9.819 14.624 15.86 | 13.4 |

TABLE 13

| | STAGE SIDE | | | |
|---|---|---|---|---|
| | Ra/μm | | Rz/μm | |
| SCANNING DIRECTION | 0.668 1.762 1.004 | 1.1 | 4.456 7.910 5.545 | 6.0 |
| OFF-SET DIRECTION | 2.656 3.070 2.304 | 2.7 | 15.518 16.657 12.219 | 14.8 |

Examples 2 to 6 described above have revealed that peeled substrates can be easily produced by forming the processed layer 14 in the substrate 10 made of SiC of 4H crystal structure by using the diffractive optical element 170 that produces three split laser beams and cleaving the substrate 10 at the processed layer 14. Measurement of the surface roughness demonstrated that smooth separation planes were formed in the peeled substrates.

Examples 2 to 6 did not demonstrate any apparent dependence on the processing speed and laser beam intensity. It is thereby inferred that production of the peeled substrates was less influenced by the processing conditions because the split laser beams minimized extension of the processed layer.

In Examples 1 to 6, the substrate 10 made of SiC of 4H crystal structure was used. However, the present embodiment is not limited thereto. The present embodiment is similarly applicable to substrates made of SiC of 6H crystal structure. In addition, the present embodiment is not limited to substrates of SiC and is similarly applicable to substrates made of sapphire and the like.

In Examples 2 to 6, only one processed layer 14 was formed parallel to the surface of the substrate 10. However, the processed layer 14 may include two or more processed layers 14 by properly setting the depth of the focusing points F through the laser light focusing section 160. The substrate 10 is then cleaved at the processed layers 14 for separation of peeled substrates.

In the case of etching the produced peeled substrate by fused alkali in Examples 2 to 6, it is preferred that etching is performed after adjusting the surface roughness of the substrate surface by diamond polishing or the like for the substrate surface as a pretreatment. This facilitates forming a mirror-finished good etched surface.

Figure 20:
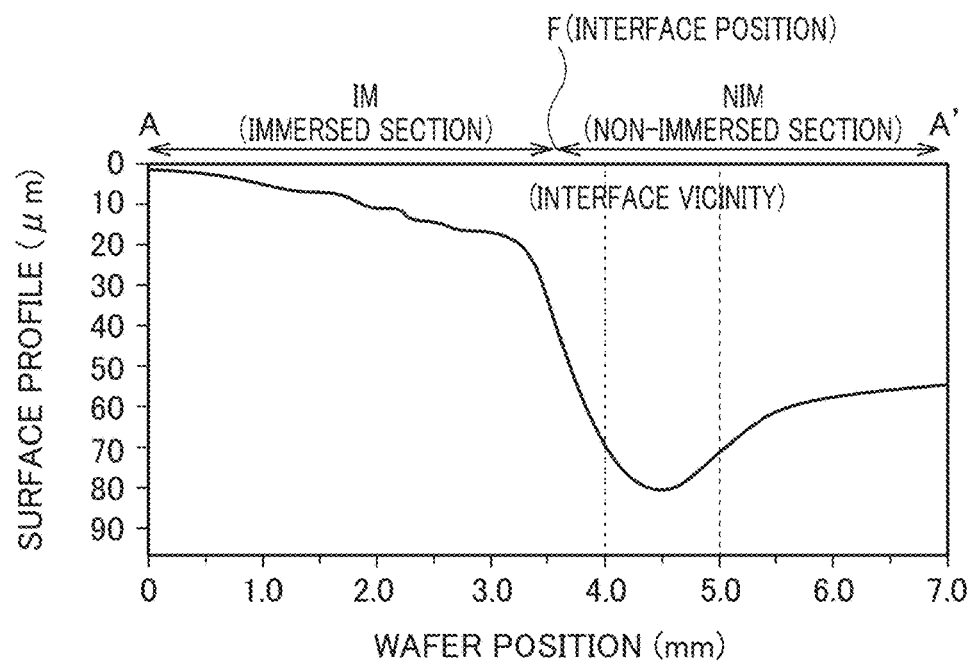
FIG. 20 is a graph diagram illustrating roughness of the substrate surface after etching in Experimental Example 1.

Experimental Example 1—Confirmation of High-Speed Mirror Finishing Phenomenon by Wet Etching In Experimental Example 1, an SiC wafer was immersed halfway in NaOH (molten sodium hydroxide) to form the immersed section IM, that was immersed in the NaOH solution, and the non-immersed section NIM, that was not immersed in the NaOH solution, for etching.
Experiment Condition and Method The inventor put about 5 g solid NaOH in a nickel (Ni) crucible and heated the same in an electric furnace to melt NaOH at 750° C. The inventor then immersed a half of an SiC wafer (SiC substrate) fixed with a Ni wire in the NaOH solution, for 20 minute etching. The used wafer was a 10 mm square 4H—SiC wafer with an off-angle of 4°. As a pretreatment, the wafer was ground using a diamond wheel (SD #1000). Evaluation of the etching rate was calculated from the difference in thickness between before and after etching. The roughness measurement was performed using a stylus-type roughness measurement system (PGI840 made by Taylor Hobson).
Etched Surface Appearance and Profile FIG. 20 illustrates the profile of the SiC wafer surface after etching. In measurement to obtain FIG. 20, the height of the surface was measured along a line on the substrate surface.

Figure 21:
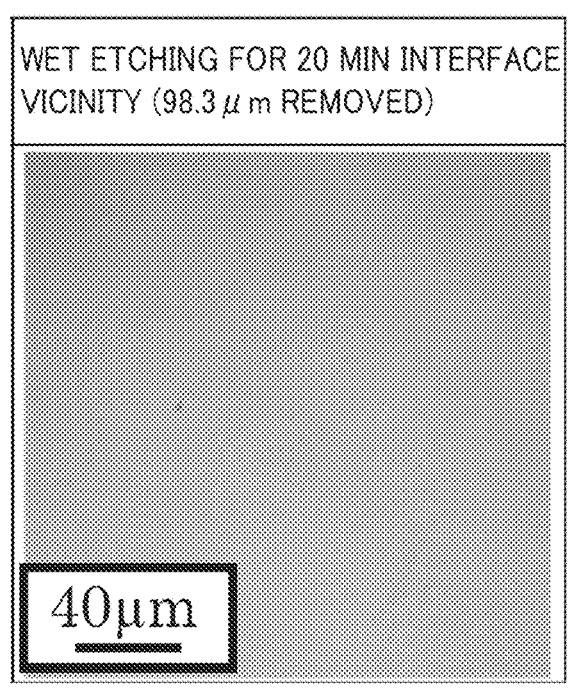
FIG. 21 is a photograph diagram illustrating an interface vicinity of a non-immersed section of the substrate surface after etching in Experimental Example 1.

FIG. 20 illustrates that the non-immersed section NIM was removed more than the immersed section IM by etching. The non-immersed section NIM was removed 60 μm more than the immersed section IM, in a region 1 mm distant from the interface position G in particular.
Detailed Observation of Etched Surface The inventor observed the immersed section IM and non-immersed section NIM (including the interface vicinity V) through laser microscopic images and took pictures thereof. The resulting pictures are illustrated in FIGS. 21 and 22.

Figure 22:
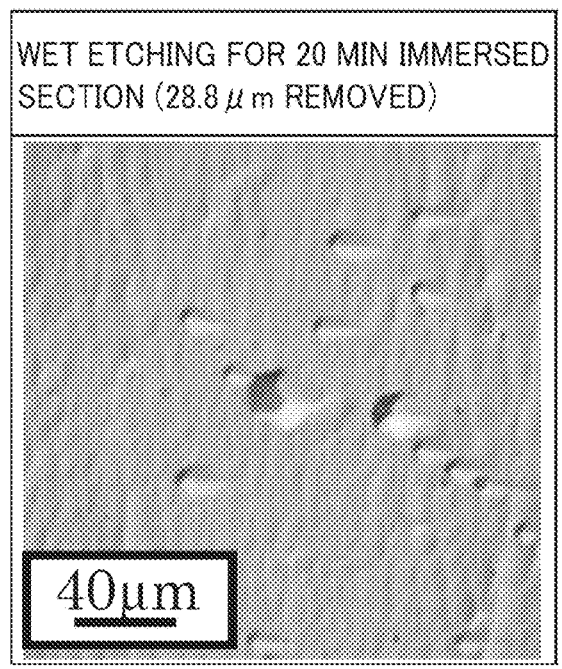
FIG. 22 is a photograph diagram illustrating an immersed section of the substrate surface after etching in Experimental Example 1.

In the immersed section IM, etch pits were observed (see FIG. 22). The non-immersed section NIM was confirmed to have a flat surface without any etch pit (see FIG. 21).

Figure 23:
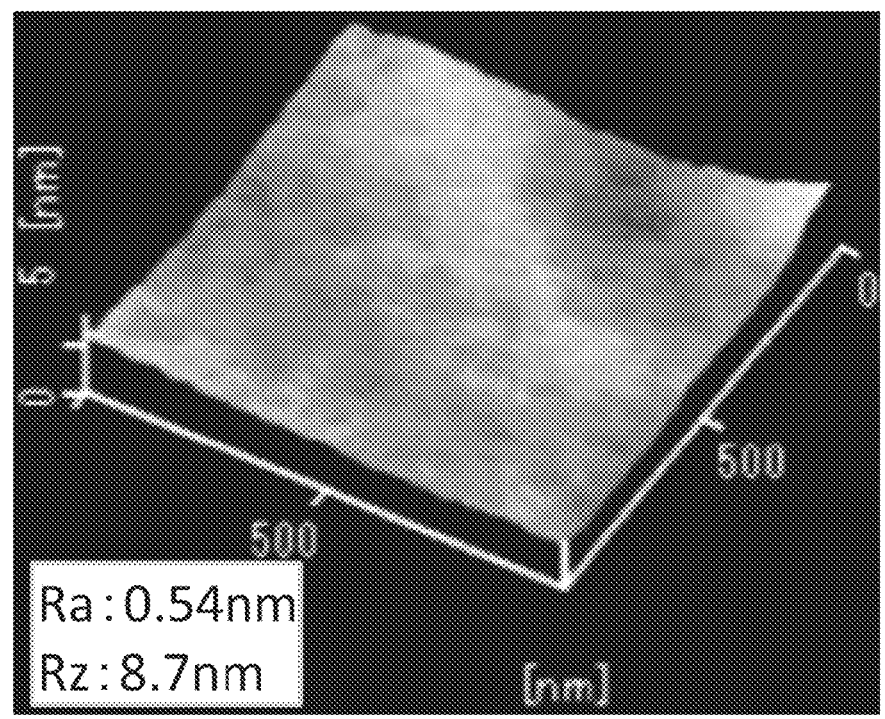
FIG. 23 is a perspective view of the non-immersed section obtained by an AFM after etching in Experimental Example 1.

Furthermore, the result of measuring the non-immersed section NIM in 1 μm×1 μm with an AFM is illustrated in FIG. 23. The measurement result confirmed that the non-immersed section NIM had a mirror surface with a roughness of 0.54 mm Ra and 8.7 nm Rz.

Experimental Example 2—Investigation of Etching Basic Property

In Experimental Example 2, the inventors performed experiments to check how the etching characteristic was influenced by the temperature and gas atmosphere.
Influence of Temperature on Attained Surface Roughness and Etching Rate Based on the experiment method of Experimental Example 1, etching experiments were performed with the experiment time set to 20 to 120 minutes and the temperature set to 600 to 750° C. In Experimental Example 2, the relationship between the etching temperature and etching rate was examined in the immersed section IM and the interface vicinity V of the non-immersed section NIM. The experiment results are illustrated in FIG. 24.

Figure 24:
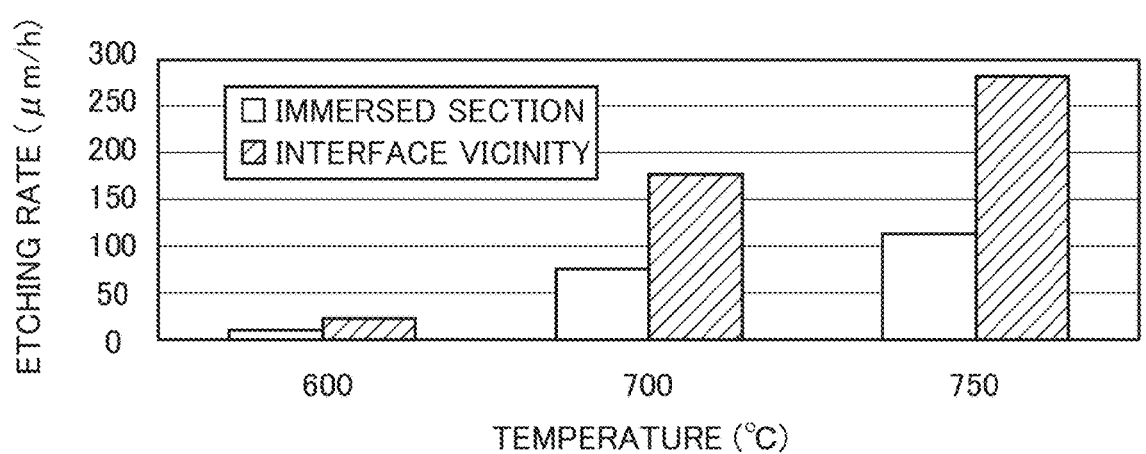
FIG. 24 is a graph diagram illustrating the relationship between etching temperature and etching rate in Experimental Example 2.

FIG. 24 illustrates that the etching rate had a tendency to increase with the temperature in both the immersed section IM and interface vicinity V and the rate of increase in etching rate in the immersed section IM was eual to that in the interface vicinity V. The etching rate in the interface vicinity V was about two to three times higher than that of the immersed section IM, which was as high as 289 μm/h at 750° C. in particular.

Figure 25:
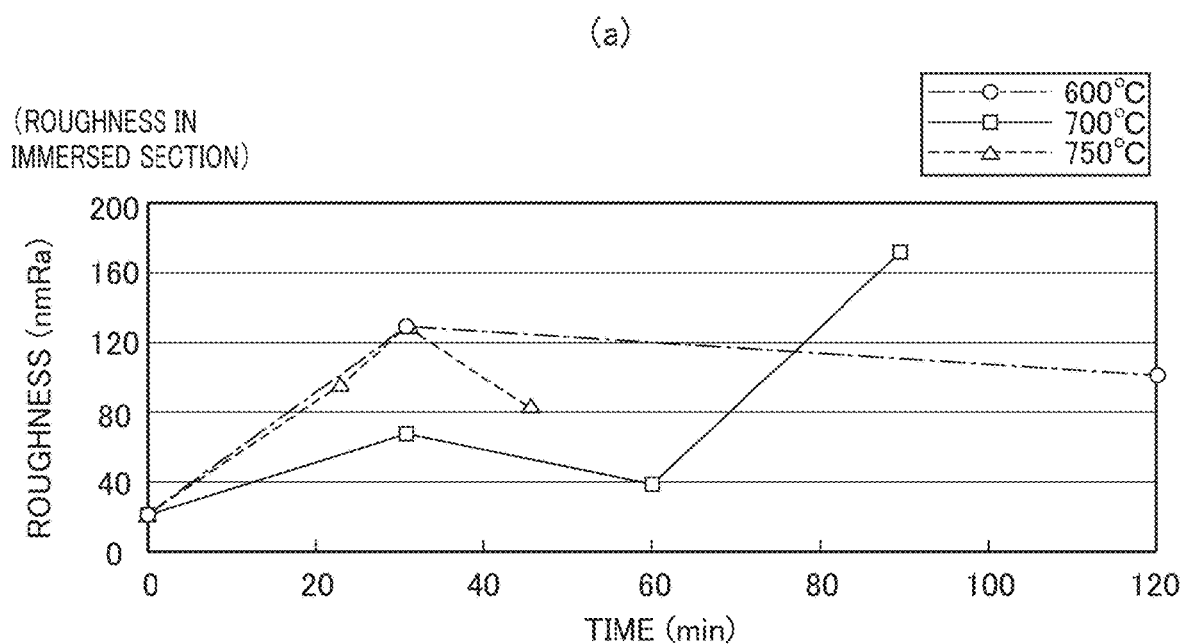
FIG. 25(a) is a graph diagram illustrating the relationship between etching time and roughness in the immersed section.
FIG. 25(b) is a graph diagram illustrating the relationship between etching time and roughness in the interface vicinity of the non-immersed section, respectively, in Experimental Example 2.
Figure 25:
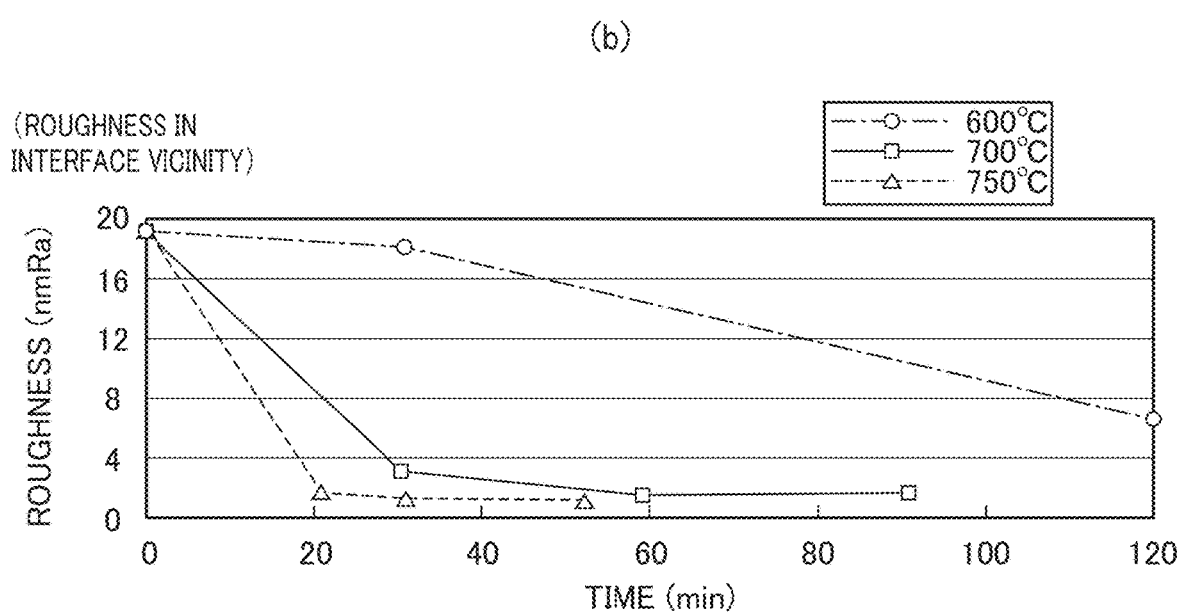

FIG. 25(a) illustrates roughness of the etched surface of the immersed section IM, and FIG. 25(b) illustrates roughness of the etched surface of the interface vicinity V of the non-immersed section NIM. In the immersed section IM, the roughness had a tendency to increase once and then decrease. From the perspective of the results of observing the etched surfaces, this was considered to be because latent damage due to diamond polishing, appeared in the early phase of etching and then the etched surface gradually smoothed.

In the immersed section IM, the etching rate was low. It is therefore thought that the experiment for 120 minutes was not long enough to reduce the roughness of the immersed section IM. However, application thereof to mirror finishing is considered to be difficult because the immersed section IM had a tendency to increase in etch pits.

As for the non-immersed section NIM, it was found that the attained surface roughness was 1.4 nm Ra when the temperature was 700° C. or higher. There were no etch pits in the results of observing the etched surfaces under any etching conditions. Etch pits also did not appear in the results of observing etched surfaces that were subjected to etching for 120 minutes at 600° C., in which the etching rate was as low as 23 μm/h.

Influence of Atmosphere on Roughness and Etching Rate

Based on the experiment conditions of Experimental Example 1, the inventor performed experiments with the experiment time set to 30 minutes in gas atmospheres of air and nitrogen (gas that displaces oxygen for inactivation) and examined the influences thereof.

Influence of Nitrogen Atmosphere

Figure 26:
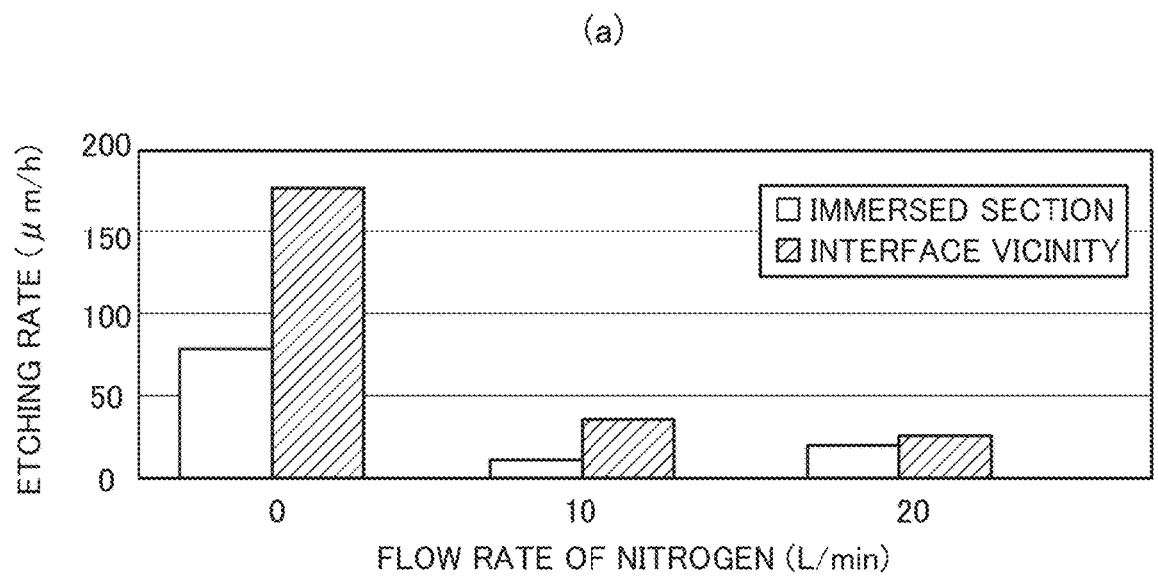
FIG. 26(a) is a graph diagram illustrating the relationship between flow rate of nitrogen and etching rate.
FIG. 26(b) is a graph diagram illustrating the relationship between flow rate of nitrogen and roughness, respectively, in Experimental Example 2.
Figure 26:
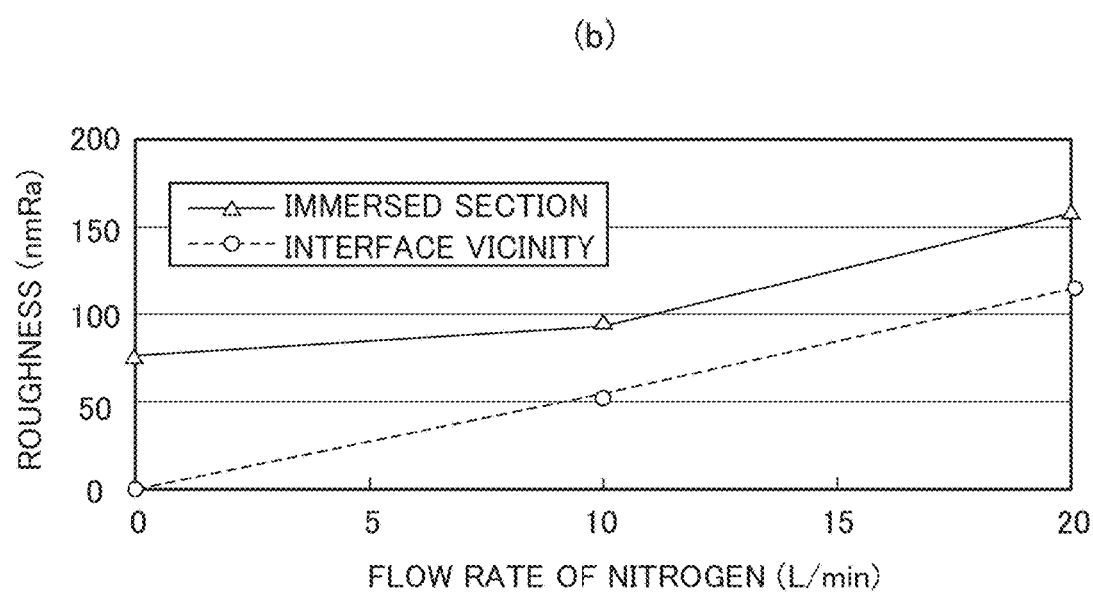

The inventor performed etching while supplying nitrogen into the electric furnace. FIG. 26(a) illustrates the relationship between the flow rate of nitrogen and etching rate in the immersed section IM and the interface vicinity V of the non-immersed section NIM. FIG. 26(b) illustrates the relationship between the flow rate of nitrogen and roughness. The flow rate of nitrogen being 0 L/min in FIG. 26(a) means that no nitrogen was supplied and the inside of the electric furnace remained in the air atmosphere.

The etching rate greatly dropped at a flow rate of nitrogen of 10 L/min in both the immersed section IM and interface vicinity V. When the flow rate of nitrogen was higher than 10 L/min, the etching rate did not change any more.

On the other hand, the roughness had a tendency to increase with the flow rate of nitrogen in both the immersed section IM and interface vicinity V. This is considered to be because latent damage due to polishing appeared first at etching and then disappeared to provide the mirror surface. In the results of observing the etched surface, latent damage was observed in both the immersed section IM and interface vicinity V. The tendency to increase in roughness is considered to be because the mirror finishing process slowed down due to the decrease in etching rate.

Influence of Air

Figure 27:
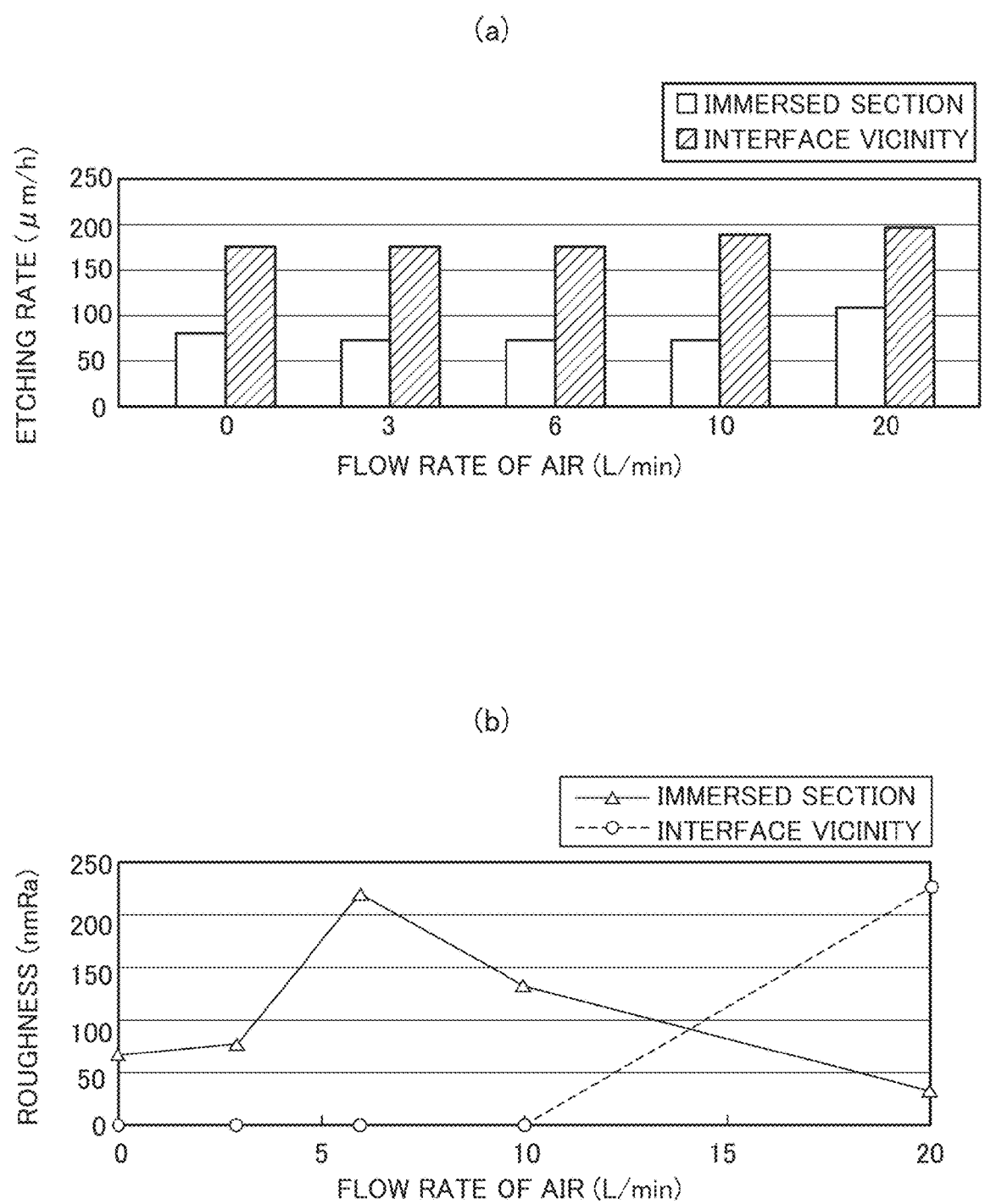
FIG. 27(a) is a graph diagram illustrating the relationship between flow rate of air and etching rate.
FIG. 27(b) is a graph diagram illustrating the relationship between flow rate of air and roughness, respectively, in Experimental Example 2.

Next, the inventor performed etching to examine the influence of air. FIG. 27(a) illustrates the relationship between the flow rate of air and etching rate in the immersed section IM and the interface vicinity V of the non-immersed section NIM. FIG. 27(b) illustrates the relationship between the flow rate of air and roughness. The etching rate remained nearly unchanged irrespective of the flow rate of air. However, it was found that in the immersed section IM, the higher the flow rate of air, the more the latent damage was removed in the same etching time. When the flow rate of air was 20 L/min, uneven film was produced in the interface vicinity V, significantly increasing the roughness.

The aforementioned experiment results and inferred matters have revealed that etching is affected by air. It is therefore thought that in the non-immersed section NIM, alkali vapor or thin film of fused alkali liquid formed by surface tension absorbs oxygen from air to promote oxidation at reaction with SiC.

Conclusion of Experimental Examples 1 and 2

As described above, the inventor found from Experimental Examples 1 and 2, a high-efficiency mirror finishing phenomenon on the SiC wafer surface in the non-immersed section, in the process of wet etching of the SiC substrate using NaOH solution. The experiments to examine the basic property thereof have revealed that the attained surface roughness was 1.4 nm Ra by etching for 20 minutes at 750° C. and the etching rate was maximized to 304 μm/h at etching for 45 minutes at 750° C. Furthermore, as for the etching atmosphere, it was found that air acts acted on etching.

The entire contents of Japanese Patent Application No. 2017-027121, filed on: Feb. 16, 2017, are incorporated by reference herein.

INDUSTRIAL APPLICABILITY

According to the present embodiment, it is possible to produce thin peeled substrates efficiently. The present embodiment therefore can be used in a wide range of fields including the semiconductor field, display field, and energy field. For example, Si (silicon) single crystal substrates are applicable to solar batteries, and sapphire substrates and the like of GaN semiconductor devices are applicable to light emission diodes, laser diodes, and the like. SiC substrates are applicable to SiC power devices, which are applicable to a wide variety of fields including the transparent electronics field, lighting field, and hybrid/electric vehicle field.

LIST OF REFERENCE SYMBOLS

10 Substrate (crystal substrate, SiC substrate)
10*p* Peeled substrate
14 Processed layer
150 Laser light source
160 Laser light focusing section (laser light condenser)
170 Diffractive optical element
AL Fused alkali
B Laser light
Ba to BcSplit laser beam
SHL Molten sodium hydroxide
θ Predetermined angle

The invention claimed is:

1. A manufacturing method for a peeled substrate, comprising:
    a substrate processing step of forming a processed layer in a substrate made of a crystal substrate, the substrate processing step including:
        a laser light focusing step of projecting laser light from a laser light source for pulse irradiation through a laser light condenser toward a surface of the substrate and focusing the laser light at a predetermined depth from the surface of the substrate within the substrate; and
        a positioning step of moving the laser light condenser relative to the substrate for positioning; and
    a substrate separation step of dividing at the processed layer, the substrate with the processed layer formed by the substrate processing step to produce a peeled substrate, wherein
    the laser light focusing step includes a laser light adjustment step of, by using a diffractive optical element configured to split the laser light from the laser light source into a plurality of split laser beams, splitting the laser light into the plurality of split laser beams so that at least one of the plurality of split laser beams has a different intensity from that of the other split laser beams, and
    the processed layer is extended by the split laser beam of relatively high intensity among the plurality of split laser beams for processing the substrate while being prevented by the split laser beam of relatively low intensity from extending.

2. The manufacturing method for a peeled substrate according to claim 1, wherein in the laser light adjustment step, the plurality of split laser beams are arranged in a row, in multiple rows, or in a pattern within the substrate.

3. The manufacturing method for a peeled substrate according to claim 2, wherein in the laser light adjustment step, at least one of the plurality of split laser beams that is located at an end has an intensity lower than that of the other split laser beams.

4. The manufacturing method for a peeled substrate according to claim 3, wherein in the laser light adjustment step, the ratio in intensity of the split laser beam of relatively high intensity to the split laser beam of relatively low intensity is in a range from 1.1 to 5.0.

5. The manufacturing method for a peeled substrate according to claim 2, wherein the positioning step moves the laser light condenser at a predetermined speed on the surface of the substrate, in a scanning direction that is at a predetermined angle to the direction of the row, multiple rows, or pattern.

6. The manufacturing method for a peeled substrate according to claim 5, wherein the positioning step repeats in combination, an operation to move the laser light condenser at a predetermined speed in the scanning direction on the surface of the substrate and an operation to shift the laser light condenser by a predetermined distance in the orthogonal direction to the scanning direction.

7. The manufacturing method for a peeled substrate according to claim 6, further comprising an etching step of etching the peeled substrate with fused alkali as an etching liquid while moving on the peeled substrate, the interface position of the fused alkali on the peeled substrate.

8. The manufacturing method for a peeled substrate according to claim 7, wherein the fused alkali is molten sodium hydroxide.

9. The manufacturing method for a peeled substrate according to claim 7, wherein the etching is performed with the fused alkali being flown.

10. The manufacturing method for a peeled substrate according to claim 9, wherein the substrate is an SiC substrate so that the peeled substrate is made of SiC.

* * * * *